US012745463B2

(12) United States Patent
Russ et al.

(10) Patent No.: US 12,745,463 B2
(45) Date of Patent: Sep. 22, 2026

(54) ESD PROTECTION DEVICE

(71) Applicant: Infineon Technologies AG, Neubiberg (DE)

(72) Inventors: Christian Cornelius Russ, Diedorf (DE); Gabriel-Dumitru Cretu, Munich (DE); Filippo Magrini, Munich (DE); Markus Eckinger, Regenstauf (DE); Chi Dong Nguyen, Munich (DE)

(73) Assignee: INFINEON TECHNOLOGIES AG, Neubiberg (DE)

( * ) Notice: Subject to any disclaimer, the term of this patent is extended or adjusted under 35 U.S.C. 154(b) by 530 days.

(21) Appl. No.: 18/191,596

(22) Filed: Mar. 28, 2023

(65) Prior Publication Data

US 2024/0332283 A1 Oct. 3, 2024

(51) Int. Cl.
*H10D 89/60* (2025.01)

(52) U.S. Cl.
CPC .................................. *H10D 89/713* (2025.01)

(58) Field of Classification Search
CPC ..................................................... H10D 89/713
See application file for complete search history.

(56) References Cited

U.S. PATENT DOCUMENTS 4,870,530 A 9/1989 Hurst et al.
6,150,697 A * 11/2000 Teshigahara ......... H10D 62/127 257/E29.027
6,439,514 B1 * 8/2002 Yamaguchi .......... H10D 12/421 257/500
2001/0038125 A1 * 11/2001 Ohyanagi ............ H10D 86/201 257/E21.418
2005/0230761 A1 * 10/2005 Imahashi ............. H10D 89/713 257/370
2008/0116480 A1 * 5/2008 Glenn .................. H10D 89/713 257/E21.388
2009/0032838 A1 * 2/2009 Tseng .................. H10D 89/713 257/133
2011/0176243 A1 * 7/2011 Zhan ................... H10D 89/711 257/E21.608
2012/0198874 A1 8/2012 Yamashita et al.
(Continued)

FOREIGN PATENT DOCUMENTS

CN 109841615 A * 6/2019

OTHER PUBLICATIONS

Gendron et al., "New High Voltage ESD Protection Devices Based on Bipolar Transistors for Automotive Applications," EOS/ESD Symposium Proceedings, Sep. 11-16, 2011, IEEE, Anaheim, CA, USA, 10 pages.

(Continued)

*Primary Examiner* — Bitew A Dinke
(74) *Attorney, Agent, or Firm* — Slater Matsil, LLP

(57) ABSTRACT

A silicon controlled rectifier (SCR) includes a first p-well region, a second p-well region, and an n-doped region. The first p-well region is coupled to a first trigger terminal via a first p-doped tap region disposed in the first p-well region. The first p-doped tap region has a higher concentration of a p-type dopant than the first p-well region. The second p-well region is coupled to a second trigger terminal via a second p-doped tap region disposed in the second p-well region. The second p-doped tap region has a higher concentration of a p-type dopant than the second p-well region.

27 Claims, 20 Drawing Sheets

(56) References Cited

U.S. PATENT DOCUMENTS

| | | | | |
|---|---|---|---|---|
| 2012/0199874 | A1* | 8/2012 | Salcedo | H10D 18/80<br>257/E21.39 |
| 2014/0111890 | A1* | 4/2014 | Chen | H10D 18/251<br>257/E29.174 |
| 2014/0111892 | A1* | 4/2014 | Chen | H02H 9/046<br>257/E29.174 |
| 2014/0138735 | A1* | 5/2014 | Clarke | H10D 84/611<br>257/119 |
| 2014/0210007 | A1* | 7/2014 | Deval | H10D 86/201<br>257/350 |

OTHER PUBLICATIONS

Salcedo et al., "Bidirectional Devices for Automotive-Grade Electrostatic Discharge Applications," IEEE Electron Device Letters, vol. 33, No. 6, Jun. 2012, 3 pages.
Zhan et al., "High-Performance Bi-directional SCR Developed on a 0.13um SOI-based Smart Power Technology for Automotive Applications," 2017 39th Electrical Overstress/Electrostatic Discharge Symposium (EOS/ESD), Sep. 10-14, 2017, IEEE, Tucson, AZ, USA, 7 pages.
Zhan et al., "High-voltage Asymmetrical Bi-directional Device for System-level ESD Protection of Automotive Applications on a BiCMOS Technology," 2013 35th Electrical Overstress/Electrostatic Discharge Symposium, Sep. 10-12, 2013, IEEE, Las Vegas, NV, USA, 8 pages.
Jian Liu et al., "Design and Analysis of Low-Voltage Low-Parasitic ESD Protection for RF ICs in CMOS," May 2011, IEEE Journal of Solid-State Circuits, vol. 46, No. 5, p. 1100-1109.

* cited by examiner 1700
104
110C
102
106
110A
110B
1220
1210
1208
1206
1204
1202
1304
1302

1800
TC12
TC11
102
TA11
TA12
TA21
TA22
104
C
TB22
TB21
B
TB12
TB11
106
TC22
TC21
A
1306
1304
1302
1202
1206
710C1
1220
1208
1210
710A1
1204
710A2
710B2
710B1
710C2

ESD PROTECTION DEVICE

CROSS-REFERENCE TO RELATED APPLICATIONS

This application relates to the following commonly assigned patent application: U.S. patent application Ser. No. 18/191,528, entitled "ESD Protection Circuit," filed on Mar. 28, 2023, now U.S. Pat. No. 12,322,953 issued on Jun. 3, 2025, which application is hereby incorporated herein by reference in its entirety.

TECHNICAL FIELD

The present invention relates generally to ESD protection, and specifically to silicon-controlled rectifiers (SCR) for ESD protection.

BACKGROUND

Silicon controlled rectifiers (SCRs), also known as thyristors, are widely used ESD protection devices. The high current capability per layout area makes SCRs particularly useful for cost reasons. Furthermore, the high current capability per parasitic capacitance of SCRs makes them particularly useful for the protection of pins requiring relatively low capacitance, such as pins designated for radio frequency (RF) signals.

The structure of an SCR can be represented as an NPN bipolar transistor interconnected with a PNP bipolar transistor such that the base region of the NPN transistor forms the collector region of the PNP transistor and vice versa. In bulk CMOS technology, an SCR is often constructed using a lateral p/n/p/n structure formed using a combination of lightly doped n-well and p-well regions that serve as "trigger" regions and heavier doped p-type and n-type diffusion regions disposed within the p-well and p-well regions that respectively serve as the anode and cathode of the SCR.

In general, SCRs constructed in bulk CMOS technology are triggered when an applied anode-cathode voltage exceeds the reverse breakdown of a junction at the interface between a lightly doped n-well region and a lightly doped p-well region. The physical geometry of the lightly doped n-well and p-well regions make them well suited for efficient triggering due to their relative physical depth, in that paths for triggering current exist underneath highly doped anode and cathode regions of the SCR.

SUMMARY

In accordance with an embodiment, a semiconductor device includes: a first p-well region and a second p-well region, the first p-well region and the second p-well region being in an n-doped region over a substrate; a first n-type cathode region in the first p-well region; a first p-type anode region in the first p-well region, the first n-type cathode region being between the first p-type anode region and the second p-well region, where the first p-type anode region has a higher concentration of a p-type dopant than the first p-well region; a second n-type cathode region in the second p-well region; a second p-type anode region in the second p-well region, the second n-type cathode region being between the second p-type anode region and the first p-well region, where the second p-type anode region has a higher concentration of the p-type dopant than the second p-well region; a first p-doped tap region in the first p-well region, the first p-doped tap region being between the first n-type cathode region and the second p-well region, the first p-doped tap region having a higher concentration of the p-type dopant than the first p-well region; and a second p-doped tap region in the second p-well region, the second p-doped tap region being between the second n-type cathode region and the first p-well region, the second p-doped tap region having a higher concentration of the p-type dopant than the second p-well region.

In accordance with another embodiment, an ESD protection circuit includes: at least one silicon controlled rectifier (SCR) device including: a first p-well region disposed in an n-doped region, the first p-well region coupled to a first trigger terminal via a first p-doped tap region, a longitudinal sidewall of the first p-doped tap region being aligned with a longitudinal sidewall of the first p-well region, the first p-doped tap region having a higher concentration of a p-type dopant than the first p-well region; a second p-well region disposed in the n-doped region, the second p-well region coupled to a second trigger terminal via a second p-doped tap region, a longitudinal sidewall of the second p-doped tap region being aligned with a longitudinal sidewall of the second p-well region, the second p-doped tap region having a higher concentration of the p-type dopant than the second p-well region; a first p-type anode region surrounded by the first p-well region and configured to be coupled to a first signal line or supply voltage, the first p-type anode region having a higher concentration of the p-type dopant than the first p-well region; a second p-type anode region surrounded by the second p-well region and configured to be coupled to a power supply node, the second p-type anode region having a higher concentration of the p-type dopant than the second p-well region; a first n-type cathode region surrounded by the first p-well region and configured to be coupled to the first signal line or supply voltage; and a second n-type cathode region surrounded by the second p-well region and configured to be coupled to the power supply node.

In accordance with a further embodiment, the embodiment being a method of ESD protection using a silicon controlled rectifier (SCR) including a first p-well region, a second p-well region, and an n-doped region, the first p-well region coupled to a first trigger terminal via a first p-doped tap region disposed in the first p-well region, the first p-doped tap region having a higher concentration of a p-type dopant than the first p-well region, the second p-well region coupled to a second trigger terminal via a second p-doped tap region disposed in the second p-well region, the second p-doped tap region having a higher concentration of a p-type dopant than the second p-well region, the method includes: detecting an ESD pulse using a trigger device; activating the SCR via the trigger device upon detection of the ESD pulse, where activating the SCR includes injecting a current through the first p-doped tap region or the second p-doped tap region; and conducting an ESD current via the SCR.

In accordance with a further embodiment, a silicon controlled rectifier (SCR) device including: a first well region and a second well region in a substrate, the first well region and the second well region being a first semiconductor type with a first doping concentration, where a region of the substrate between the first well region and the second well region is a second semiconductor type, the second semiconductor type being opposite the first semiconductor type; a first electrode region in the first well region and a second electrode region in the second well region, the first electrode region and the second electrode region are the second semiconductor type; a third electrode region and a first tap region in the first well region, where the third electrode region and the first tap region have respective doping concentrations greater than the first doping concentration; and a fourth electrode region and a second tap region in the second well region, where the fourth electrode region and the second tap region have respective doping concentrations greater than the first doping concentration.

BRIEF DESCRIPTION OF THE DRAWINGS

For a more complete understanding of the present invention, and the advantages thereof, reference is now made to the following descriptions taken in conjunction with the accompanying drawings, in which.

Corresponding numerals and symbols in different figures generally refer to corresponding parts unless otherwise indicated. The figures are drawn to clearly illustrate the relevant aspects of the preferred embodiments and are not necessarily drawn to scale. To more clearly illustrate certain embodiments, a letter indicating variations of the same structure, material, or process step may follow a figure number.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

In various embodiments, an electrostatic discharge (ESD) protection circuit includes one or more bidirectional silicon controlled rectifiers (SCRs) coupled between a first node and a second node to form a first conductive path and one or more active clamp circuits coupled between the first node and the second node to form a second conductive path. The first node and second node may be coupled to, for example, pins of a controller area network (CAN), a local interconnect network (LIN), or the like, which may be part of an automobile. The ESD protection circuit provides protection for ESD currents between pins. During an ESD event, an initial ESD current is shunted through an active clamp circuit until a pre-determined trigger IV-point is reached, at which point one of the SCRs is triggered and safely shunts the ESD pulse between the first node and the second node. The combination of an active clamp circuit and a bidirectional SCR may be useful for decreasing power dissipation, lowering area consumption, reducing the clamping voltage, and providing increased ESD design robustness.

In various embodiments, a bidirectional SCR that may be used in an ESD protection circuits as a snapback device includes two well regions in a substrate. Each well region includes two respective electrode regions (e.g., a cathode region and an anode region) and an additional tap region (also referred to as a dual-purpose tap region). The tap region may be used for trigger current injection into a transistor of the bidirectional SCR and for increasing the holding voltage of the transistor by providing a high local base doping. The bidirectional SCR allows support for reverse polarity protection and may provide reduced layout area in comparison with, for example, a pair of antiparallel unidirectional SCRs.

Figure 1:
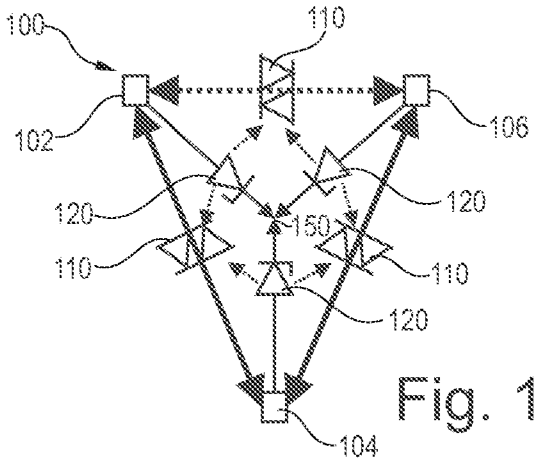
FIG. 1 illustrates a diagram of an ESD protection circuit, in accordance with some embodiments.

FIG. 1 shows a generalized diagram of an ESD protection circuit 100, in accordance with some embodiments. A first node 102, a second node 104, and a third node 106 may be coupled to pads or pins of a CAN bus or LIN bus, such as in an automobile. In some embodiments, the first node 102 is coupled with a signal line or supply potential (e.g., a CAN low differential signal or CANL), the second node 104 is coupled with a power supply node (e.g., ground), and the third node 106 is coupled with another signal line or supply potential (e.g., a CAN high differential signal or CANH). However, the first node 102, the second node 104, and the third node 106 may be coupled with any suitable circuit elements.

A first bidirectional SCR 110 is coupled between the first node 102 and the second node 104 and forms a first conduction path between them. A second bidirectional SCR 110 is coupled between the second node 104 and the third node 106 and forms a second conduction path between them. In some embodiments, a third bidirectional SCR 110 is present between the first node 102 and the third node 106 and forms a third conduction path between them. The third bidirectional SCR 110 may be present for applications where ESD protection is advantageous between the first node 102 (e.g., CANL) and the third node 106 (e.g., CANH), such as for protection from a 2 kV HBM ESD rather than from an 8 kV harsh system level ESD by gun pulses. The bidirectional SCRs 110 may also be referred to as a V-connected SCR network in embodiments with two bidirectional SCRs 110 or a delta-connected SCR network in embodiments with three bidirectional SCRs 110.

Three active clamp circuits 120 (also referred to as clamp circuits or trigger circuits) are coupled together at a star node 150. The first active clamp circuit 120 forms a conduction path between the first node 102 and the star node 150, the second active clamp circuit 120 forms a conduction path between the second node 104 and the star node 150, and the third active clamp circuit 120 forms a conduction path between the third node 106 and the star node 150. The first active clamp circuit 120 and the second active clamp circuit 120 are coupled to control terminals of the first bidirectional SCR 110, and the second active clamp circuit 120 and the third active clamp circuit 120 are coupled to control terminals of the second bidirectional SCR 110. In embodiments in which the third bidirectional SCR 110 is present between the first node 102 and the third node 106, the first active clamp circuit 120 and the third active clamp circuit 120 are coupled to control terminals of the third bidirectional SCR 110.

An ESD event may occur between any two of the three nodes 102, 104, and 106. During operation of the ESD protection circuit 100, an initial ESD current (also referred to as a "pre-trigger current" $I_{t1}$ that may be in a range of 100 mA to 2.0 A) is shunted through a conduction path through an active clamp circuits 120 that are coupled at the star node 150. When the ESD current exceeds a first level (such as $I_{t1}$), one of the bidirectional SCRs 110 is triggered so that the ESD current above the first level flows through a conduction path through one or more of the bidirectional SCRs 110.

The conductive paths through the active clamp circuits 120 begin to conduct at a pre-determined threshold voltage level (on-voltage $V_{on}$, which may be in a range of 3 V to 130 V) that is above the supply voltage $V_{supply}$ (which may be in a range of 2 V to 120 V) and above the absolute maximum rating voltage $V_{AMR}$ (which may be in a range of 2.5 V to 125 V). During an ESD event, at a pre-determined trigger IV-point (a multiple of trigger current $I_{t1}$ and trigger voltage $V_{t1}$, which may be in a range of 4 V to 140V), one of the bidirectional SCRs 110 is triggered and activated by the active clamp circuit 120 conducting the initial ESD current. The bidirectional SCR 110 then shunts the ESD pulse at a holding voltage $V_h$ (which may be in a range of 1 V to 40 V) that is lower than the trigger voltage $V_{t1}$. The absolute maximum rating voltage $V_{AMR}$ may also be higher than the holding voltage $V_h$. The bidirectional SCR 110 provides a discharge shunt path for up to very high current levels, such as a second breakdown current $I_{t2}$ less than 25 A, or current in a range of 1 A to 50 A. A high current ESD operating mode of the ESD protection circuit 100 under ESD conditions may operate at a voltage $V_{ESD}$ (which may be in a range of 1.5 V to 140 V) and $I_{ESD}$ (which may be in a range of 0.5 A to 25 A). Margins may be included between $V_{ESD}$ and a respective voltage $V_{t2}$ (the margin may be a voltage of 1 V or greater) and between $I_{ESD}$ and current $I_{t2}$ (the margin may be a current of 100 mA or greater) at which thermal device failure occurs.

As an example, a positive ESD stress event may occur between the first node 102 (e.g., CANL) and the second node 104 (e.g., ground). A conduction path through the star node 150 and the active clamp circuits 120 coupled to the first node 102 and 104 conducts the initial ESD current above the turn-on voltage $V_{ON}$. At the trigger IV-point, the main current path through the bidirectional SCR 110 coupled to the first node and the second node is triggered so that the ESD current flows along the conduction path through the bidirectional SCR 110 and essentially no current continues to flow across the initial conduction path through the active clamp circuits 120 and the star node 150. Once the ESD event ends, all ESD clamp elements (in other words, the bidirectional SCRs 110 and the active clamp circuits 120) turn off and the circuit returns to a neutral state to wait for a subsequent ESD event or be in an operational condition.

Figure 2:
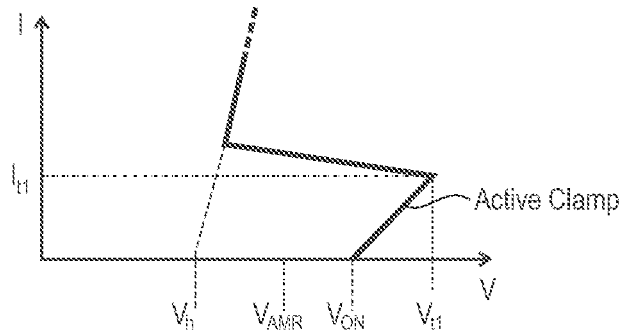
FIG. 2 illustrates a graph showing the performance of an ESD protection circuit, in accordance with some embodiments.

FIG. 2 is a graph of current versus voltage illustrating the performance of an ESD protection circuit 100 during an ESD event, in accordance with some embodiments. At a threshold voltage, a conductive path through active clamp circuits 120 (see above, FIG. 1) activates and begins conducting the ESD current. When the voltage and current reach a trigger current $I_{t1}$ and trigger voltage $V_{t1}$, a bidirectional SCR 110 is activated and begins conducting the vast majority of the ESD current. The voltage then snaps back to a significantly lower voltage while the discharge current continues to increase, allowing the bidirectional SCR 110 to safely conduct the discharge without causing thermal damage. For this reason, the bidirectional SCR 110 is also referred to as a snapback device.

The combination of the active clamp (e.g., the active clamping circuits 120) and the snapback device (e.g., the bidirectional SCRs 110) allows the ESD protection circuit 100 to reach higher trigger current $I_{t1}$ and trigger voltage $V_{t1}$ before activating the snapback device, which is advantageous for reducing or preventing unintended snapback triggering that can lead to undesirable latch-up events. The trigger current $I_{t1}$ and trigger voltage $V_{t1}$ may be set by design, enabling tuning of the trigger current. The active clamp circuits 120 arranged in a star configuration (see above, FIG. 1) allow for implementing a pre-trigger current shunt with reverse polarity protection and achieving a high trigger current with a reduced layout area. In other words, coupling the active clamp circuits 120 in a star configuration allows a pre-determined amount of current to be shunted before triggering SCRs in either direction between nodes at different potential, which provides protection for currents of either polarity. The star configuration implements this in a compact way. Each active clamp circuit 120 in the star configuration can be used to activate SCR devices in more than one ESD path The bidirectional SCRs 110 arranged in a V-configuration or delta-configuration (see above, FIG. 1) provide a compact way to achieve reverse polarity protection.

Figure 3:
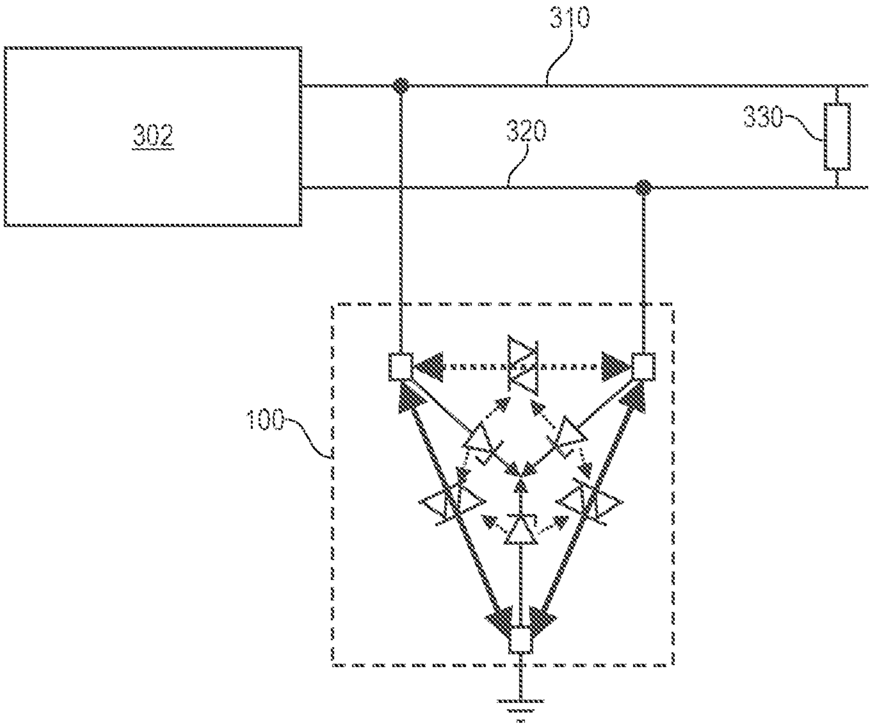
FIG. 3 illustrates a schematic of a network 300 including the ESD protection circuit, in accordance with some embodiments.

FIG. 3 is a schematic of a network 300 including the ESD protection circuit 100, in accordance with some embodiments. A communications node 302 is coupled to a first signal line 310 and a second signal line 320. The first signal line 310 and the second signal line 320 are separated by an effective resistor 330 with a high resistance, such as a resistance in a range of 20Ω to 200Ω. In some embodiments, the network 300 is a CAN, the communications node 302 is a CAN node that includes a CAN transceiver coupled with a CAN controller, the first signal line 310 is a CANH line, the second signal line is a CANL line, and the resistor 330 is a CAN bus termination terminal resistor (e.g., 120 (2). However, the network 300 may be any suitable network, e.g. a LIN.

The ESD protection circuit 100 is coupled to the first signal line 310, the second signal line 320, and a power supply node (e.g., ground). As such, the ESD protection circuit 100 provides protection for the communications node 302 from damage due to ESD events between any of the first signal line 310, the second signal line 320, and ground.

In order to provide robustness against latch-up of the ESD protection circuit 100, it may be advantageous to have a trigger current greater than 150 mA, or up to 1.4 A. In some embodiments, a network 300 including an ESD protection circuit 100 is a CAN bus system in an automobile that includes up to 20 communications nodes 302 that communicate on the same CAN bus structure. Short-to-battery malfunctions of the CAN bus system may occur in which the CANH or CANL line(s) are shorted to the car battery, across an electric potential difference of, for example, up to 18 V. The short-to-battery may be across a connection with a parasitic line inductance in a range of 20 μH to 40 μH. During the setting of an acknowledgement bit, the current in the parasitic line inductance is the sum of the short-circuit current of all the transceivers of the CAN bus system. For example, in a CAN bus system with 16 nodes and 85 mA per node, the total current would be 1.38 A. During the transition from a dominant to a recessive bus logic state, the energy stored in the parasitic inductance is then dissipated in the ESD structures of each of the transceivers. However, the various transceivers may originate from different manufacturers and have different IV characteristics. A worst-case assumption is that one node has a low breakdown voltage while the other nodes have high breakdown voltages, so that a total short circuit current spike may be forced into one ESD clamp of one node on the bus only (as whichever node triggers at the lowest voltage will take the entire current). Therefore, the ESD clamp advantageously should to be able to handle this power dissipation either before or after snapback triggering.

A typical situation at an integrated circuit of a node (such as in a case of conduction before snapback) may be at 50 V for a peak current of 1 A that decays after 1.6 μs resulting in an energy dissipation of 40 μJ. As such, it may be advantageous for an ESD protection circuit to have a holding voltage $V_h$ greater than a supply or signal voltage $V_{CC}$ of, e.g., 7 V, or a holding voltage $V_h$ greater than a common mode range voltage $V_{CMR}$ (such as used in CAN applications) of, e.g., 13.5 V. Embodiments of this disclosure provide a holding voltage $V_h$ of at least 18 V, which has a margin over the supply or signal voltage $V_{CC}$ and the common mode range voltage $V_{CMR}$.

Figure 4:
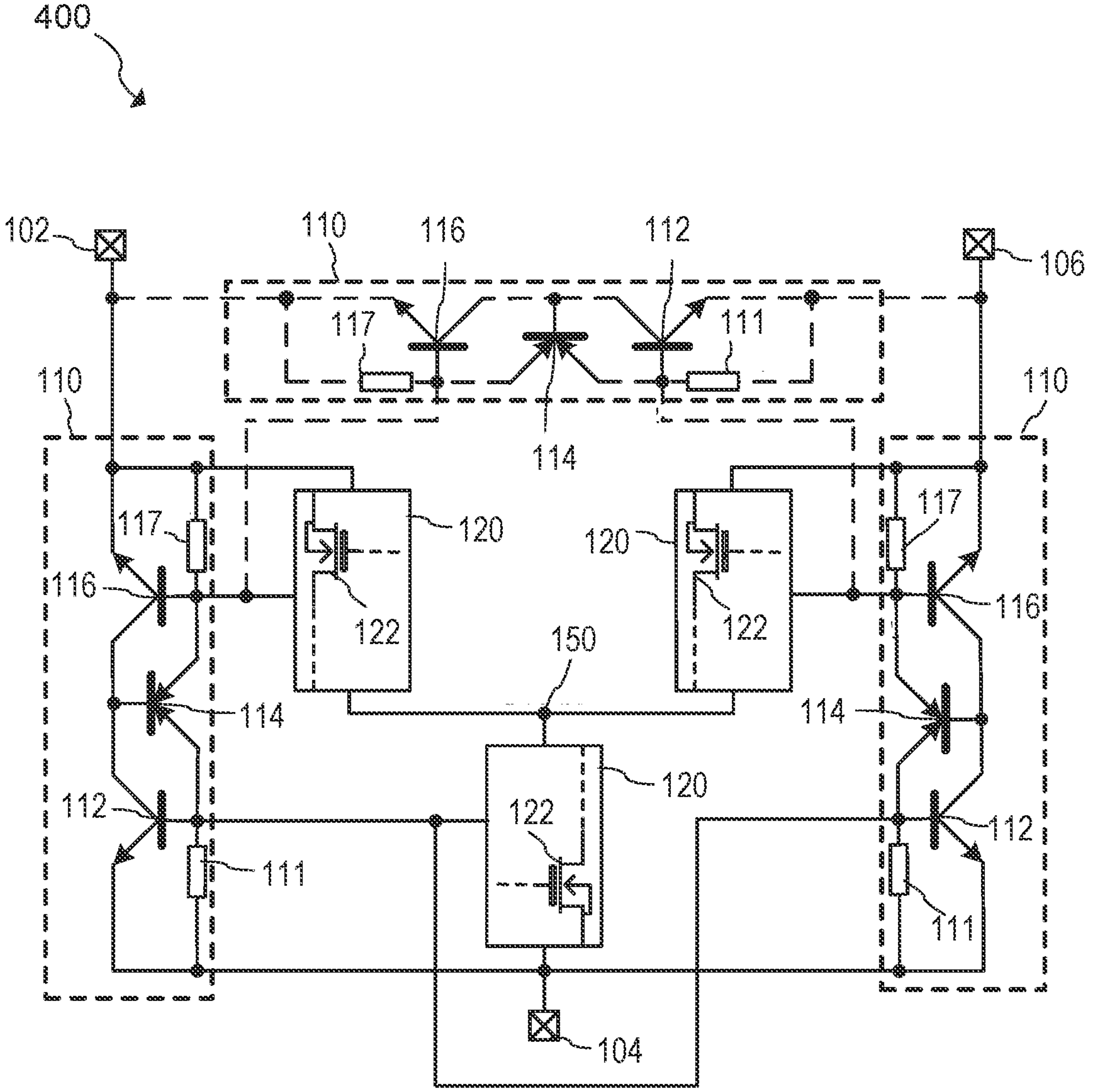
FIGS. 4-11 are schematics of ESD protection circuits, in accordance with some embodiments.

FIG. 4 illustrates an ESD protection circuit 400, in accordance with some embodiments. As shown, the ESD protection circuit 400 is a way to implement the ESD protection circuit 100 (see above, FIG. 1). Each of the active clamp circuits 120 comprises a respective transistor 122 (e.g., a MOS trigger transistor, shunt transistor, or combination thereof). As illustrated, each of the bidirectional SCRs 110 includes a first transistor 112, a second transistor 114, a third transistor 116, a first base-emitter resistor 111, and a second base-emitter resistor 117. The first base-emitter resistor 111 is coupled between the base of the first transistor 112 and the emitter of the first transistor 112, and the second base-emitter resistor 117 is coupled between the base of the third transistor 116 and the emitter of the third transistor 116.

In some embodiments, the first transistor 112 and the third transistor 116 are NPN transistors and the second transistor 114 is a PNP transistor. However, in other embodiments the polarities of the dopants of the SCRs are reversed, so that the first transistor 112 and the third transistor 116 are PNP transistors and the second transistor 114 is an NPN transistor. Any embodiment of this disclosure has a corresponding embodiment with a same structure but having the polarities of the various p-doped and n-doped components reversed.

As illustrated in FIG. 4, the bidirectional SCRs 110 are triggered by trigger current provided from the active clamp circuits 120 to bases of the first transistors 112 and the third transistors 116, which may be p-doped regions in embodiments where the first transistor 112 and the third transistor 116 are NPN transistors. In some embodiments, the active clamp circuits 120 are coupled with respective p-doped tap regions (see below, FIG. 12A) of the first transistors 112 and the third transistors 116 to inject trigger currents into the bidirectional SCRs 110. This mode of triggering is also referred to as p-tap triggering.

Figure 5:
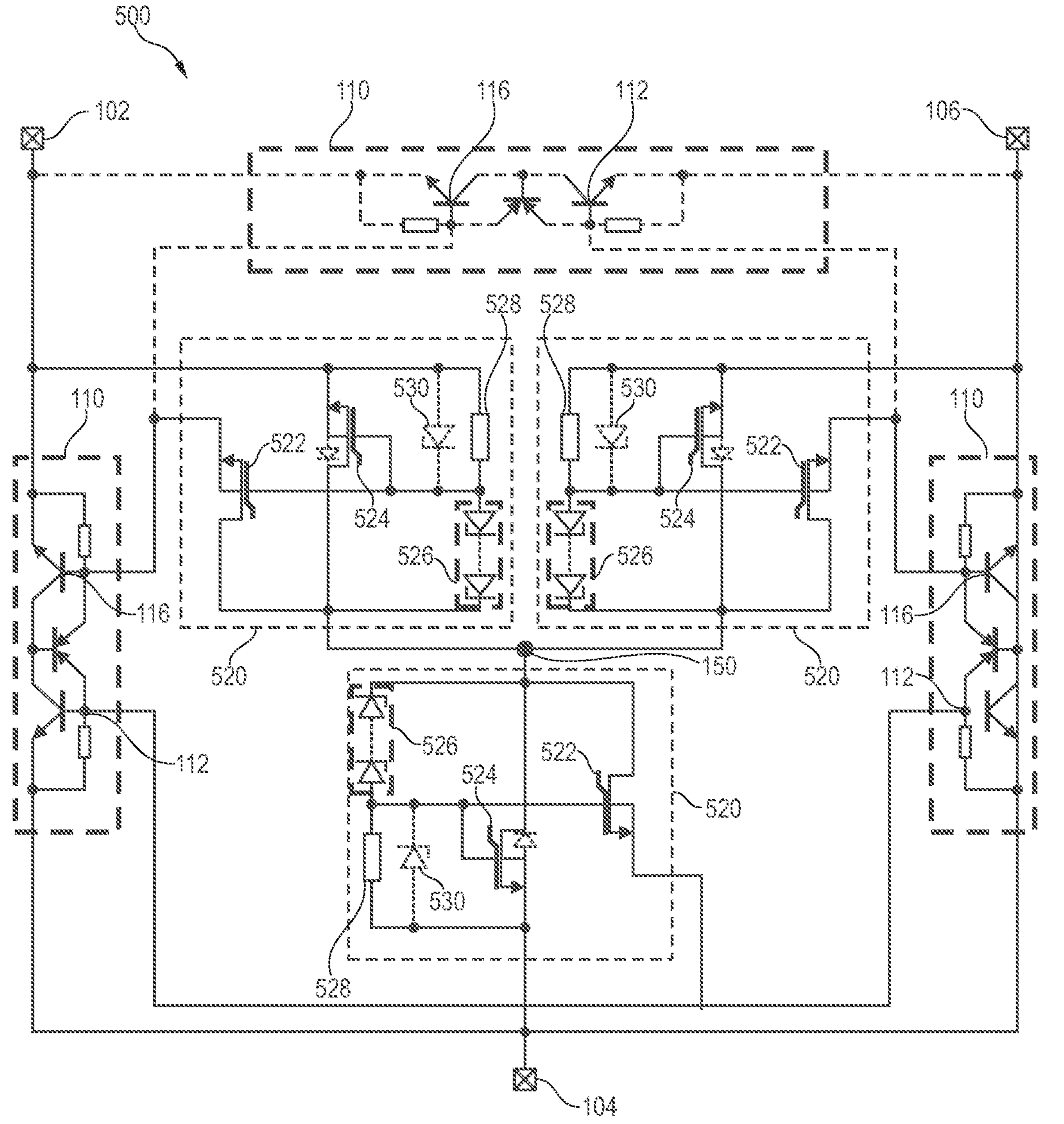

FIG. 5 illustrates an ESD protection circuit 500, in accordance with some embodiments. As shown, the schematic of ESD protection circuit 500 provides a more detailed diagram of a way to implement the ESD protection circuit 400 that shows details of active clamp circuits 520 (which replace the less detailed active clamp circuits 120 of FIG. 4). The couplings of the active clamp circuits 520 to the star node 150 and to the bidirectional SCRs 110 are the same as the couplings of the active clamp circuits 120 to the star node 150 and to the bidirectional SCRs 110 shown above in FIG. 4, and the details are not repeated herein.

Each active clamp circuit 520 comprises a trigger transistor 522 (also referred to as TrigMOS), a shunt transistor 524 (also referred to as a large shunt MOS transistor or BigMOS), a Zener diode chain 526, and a resistor 528. During an ESD event, the Zener diode chain 526 starts to conduct above a threshold voltage $V_{on}$. Current across the resistor 528, which may have a resistance in a range of 0.1 kΩ to 100 kΩ, such as 10 kΩ, provides gate bias to both the large shunt transistor 524 and the smaller trigger transistor 522. A body diode of the shunt transistor 524 between its drain and source is illustrated in dashed lines. An optional limiter diode 530 between gate and source of the shunt transistor 524 limits the gate-source voltage to safe levels in order to provide advantageously large gate drive without damaging the MOS devices. The current across the active clamp 520 is provided from another active clamp via the star node 150, which acts as a forward body diode in this reverse direction (in other words, reversed from its triggering mode of operation) across the star node 150. Then, the trigger current of the trigger transistor 522 is fed into the base region of the respective first transistor 112 or second transistor 116 of the bidirectional SCR 110. In some embodiments where the trigger current is injected into p-doped tap regions of the bidirectional SCR 110, the trigger transistor 522 is an NMOS pull-up transistor.

Once the base-emitter voltage of the respective first transistor 112 or second transistor 116 exceeds a threshold voltage (e.g., a voltage of about 0.7 V), the bidirectional SCR 110 will turn on directly between two of the three nodes 102, 104, and 106 and act as the main ESD shunt element. The intrinsic trigger current of the bidirectional SCR 110, the shunt current through the base-emitter resistors 111 and 117 (see above, FIG. 4) and the size ratio of the trigger transistor 522 versus the shunt transistor 524 will determine the overall trigger current $I_{t1}$, which is effectively observable between two of the three nodes 102, 104, and 106.

The effective gate-source bias voltage of the trigger transistor 522 may be lower than the gate-source voltage $V_{GS}$ of the shunt transistor 524 because of a base-emitter series diode in the first transistor 112 or the second transistor 116 (e.g., an NPN) of the bidirectional SCR 110. However, the laterally diffused metal-oxide semiconductor (LDMOS) devices used as MOS devices can receive a high gate bias during an ESD event (e.g., the limiter diode 530 providing voltage clamping in a range of 6 V to 8 V) so that the gate-source voltage $V_{GS}$ loss due to one NPN base-emitter voltage $V_{BE}$ of, e.g., about 0.7 V is negligible.

Figure 6:
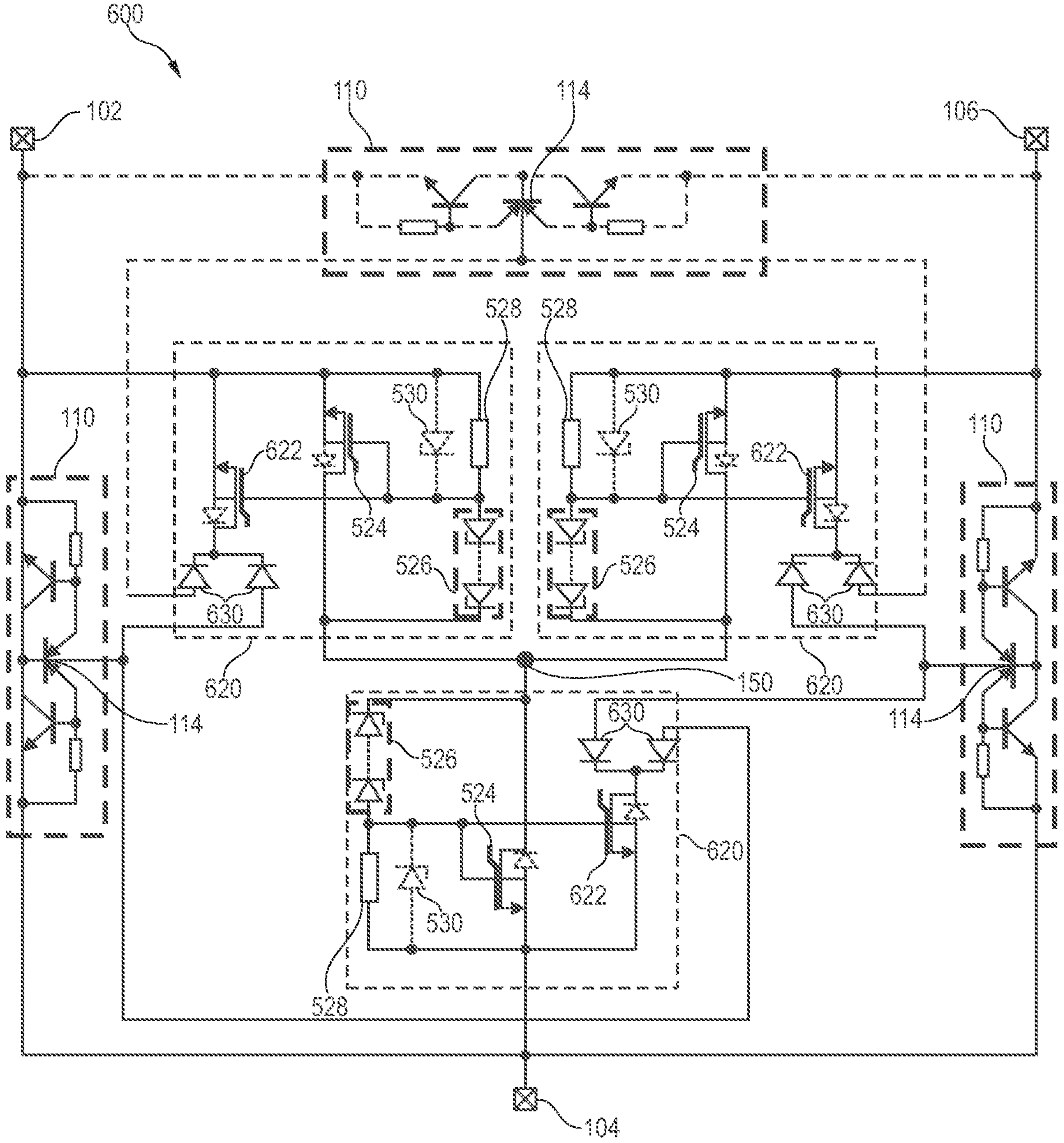

FIG. 6 illustrates an ESD protection circuit 600, in accordance with some embodiments. While the ESD protection circuits 400 and 500 (see above, FIGS. 4-5) perform triggering by current injection into the outer transistors (e.g., NPN transistors) of the bidirectional SCRs 110, the ESD protection circuit 600 includes triggering of the bidirectional SCRs 110 by active clamp circuits 620 through the central second transistors 114 (e.g., PNP transistors), such as through central n-regions of the second transistors 114. This mode of triggering is also referred to as n-tap triggering.

The active clamp circuits 620 are similar to the active clamp circuits 520 (see above, FIG. 5) with the addition of decoupling diodes 630. Respective body diodes of a trigger transistor 622 and the shunt transistor 524 between their respective drains and sources are illustrated in dashed lines. Decoupling diodes 630 are included between the trigger transistor 622 and the bidirectional SCRs 110 to avoid shunting of the trigger current by the body diode of the respective trigger transistor 622 in the complementary, anti-serial active clamping circuit 620. These decoupling diodes 630 may be small, such as with reverse breakdown voltages in a range of 4 V to 140 V. The decoupling diodes 630 may be composed of the same type of voltage-resistance MOS transistors as used in the active clamp circuits 520 with the MOS transistor having the gate connected to the source so that the body diode is effectively utilized. Due to n-tap triggering, the trigger transistor 622 may be of the NMOS pull-down type without any loss in gate-source voltage $V_{GS}$. In other words, the respective sources of the MOS transistors 524 and 622 may each be connected to one of the nodes 102, 104, or 106.

Although FIGS. 4-5 and 7-11 illustrate embodiments of ESD protection circuits with p-tap triggering, it should be understood that the n-tap triggering as illustrated in and described with respect to FIG. 6 may be implemented in any of the embodiments illustrated by FIGS. 4-5 and 7-11.

Figure 7:
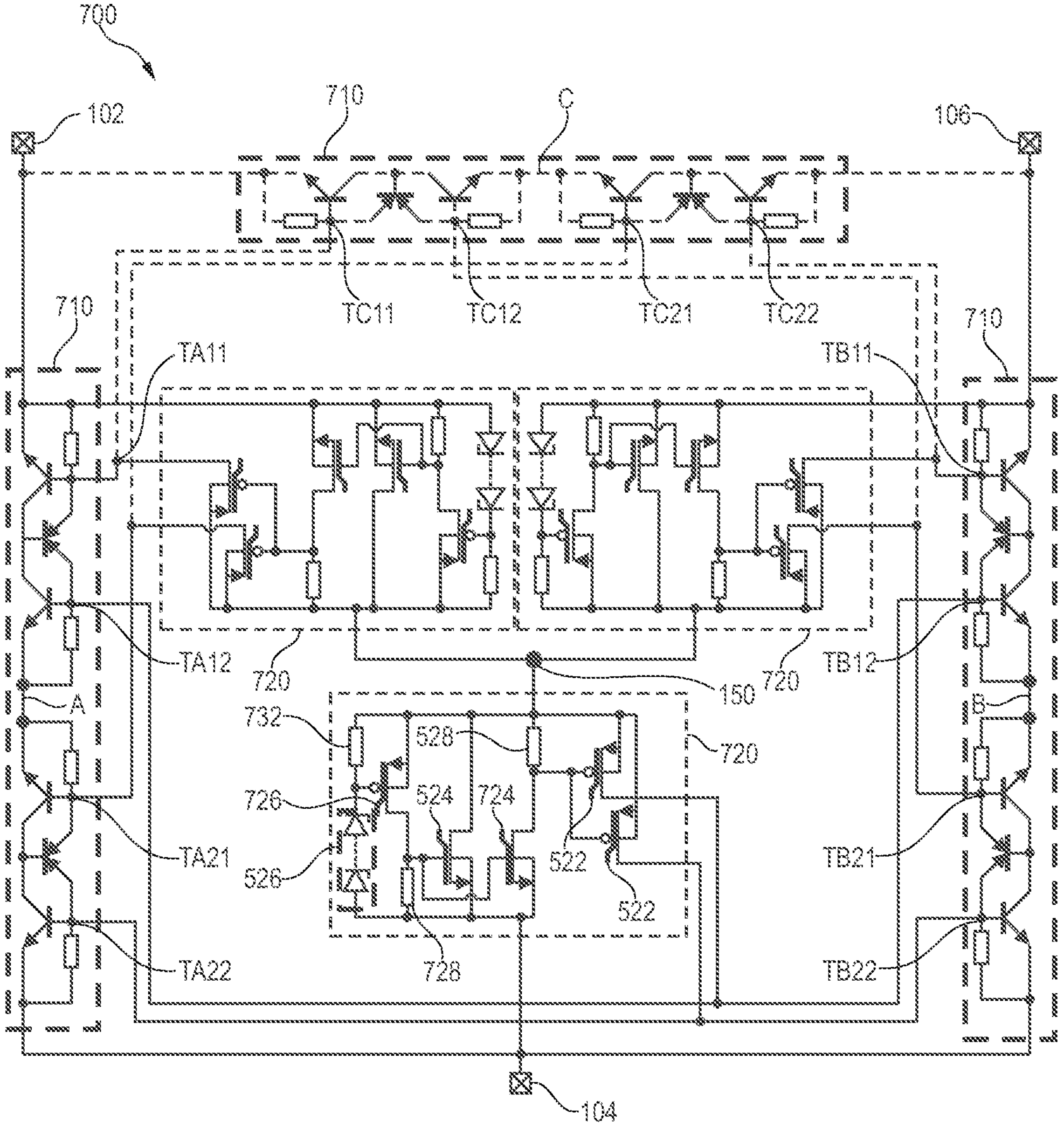

FIG. 7 illustrates an ESD protection circuit 700 with stacked bidirectional SCRs between each pair of nodes, in accordance with some embodiments. In cases where a single SCR stage does not meet a desired holding voltage, additional holding voltage tuning may be accomplished by stacking SCR stages to include two (or more) SCRs between pairs of the nodes 102, 104, and 106. In the example of FIG. 7, the ESD protection circuit 700 includes a first SCR stack 710 coupled along a conduction path between the first node 102 and the second node 104 and a second SCR stack 710 coupled along a conduction path between the second node 104 and the third node 106. In some embodiments, a third SCR stack 710 is coupled along a conduction path between the first node 102 and the third node 106. As illustrated, each SCR stack 710 includes a pair of bidirectional SCRs in series. However, in other embodiments, one or more of the SCR stacks 710 is replaced by a single bidirectional SCR. One or more of the SCR stacks 710 may also include any suitable number of bidirectional SCRs, such as three or more.

In the example of FIG. 7, the SCR stacks 710 of the ESD protection circuit 700 are fully triggered SCR stacks, such that both bidirectional SCRs of each SCR stack 710 receive a trigger signal. In order to separate the trigger terminals (also referred to as control terminals), active clamp circuits 720 of the ESD protection circuit 700 include parallel trigger transistors 522, each of which is coupled to trigger terminals of the SCR stack 710. The active clamp circuits 720 provide triggers to respective SCR stacks 710 at trigger terminals TA11, TA12, TA21, TA22, TB11, TB12, TB21, TB22, TC11, TC12, TC21, and TC22.

A trigger circuit based on PMOS pull-up may be used because a gate-source voltage Vas-loss could lead to, for example, an upper SCR stage (e.g., a single bidirectional SCR) of an SCR stack 710 not triggering due to the holding voltage of the lower SCR stage. This could elevate the voltages at internal nodes A, B, and C between the SCR stages of each SCR stack 710. Each active clamp circuit 720 is similar to the active clamp circuits 520 (see above, FIG. 5) with the addition of a second trigger transistor 522, a respective trigger buffer 724, and a respective trigger amplifier 726, which may be suitable MOS devices. Current across a first resistor 528 provides gate bias to both of the parallel trigger transistors 522, current across a second resistor 728 provides gate bias to the shunt transistor 524 and the trigger buffer 724, and current across a third resistor 732 provides gate bias to the trigger amplifier 726.

Figure 8:
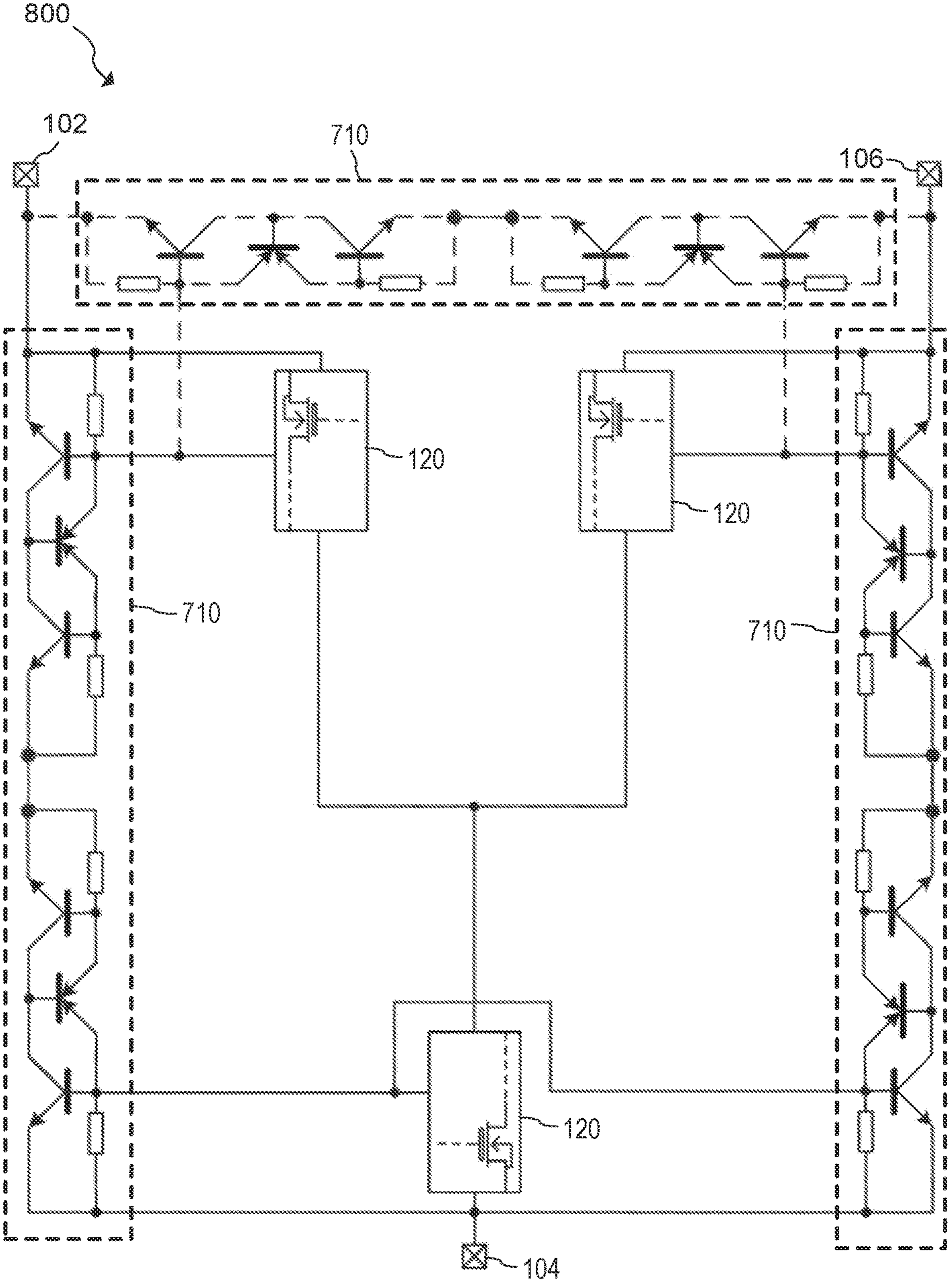

FIG. 8 illustrates an ESD protection circuit 800, in accordance with some embodiments. The ESD protection circuit 800 is a simplified version of the ESD protection circuit 700 with stacked bidirectional SCRs but with only one SCR (at a time) in each SCR stack 710 receiving a trigger from an active clamp circuit 120. (Although not illustrated, both SCRs in each SCR stack may have trigger connections but only one SCR at a time receives a trigger signal.) The other SCR in each SCR stack 710 may be triggered by an avalanche breakdown of a junction between a p-well region and a surrounding n-doped region (see below, FIG. 12A). The ESD protection circuit 800 may operate when an intended trigger voltage $V_{t1}$ of an entire SCR stack 710 is higher than an avalanche breakdown voltage $V_{BD}$ of a single SCR but less than 2 times the avalanche breakdown voltage $V_{BD}$. In other words, upon the triggering of a first SCR in an SCR stack 710 by an active clamp circuit 120, the remaining voltage across the other SCR in the SCR stack 710 will still be high enough to create triggering by avalanche breakdown.

Figure 9:
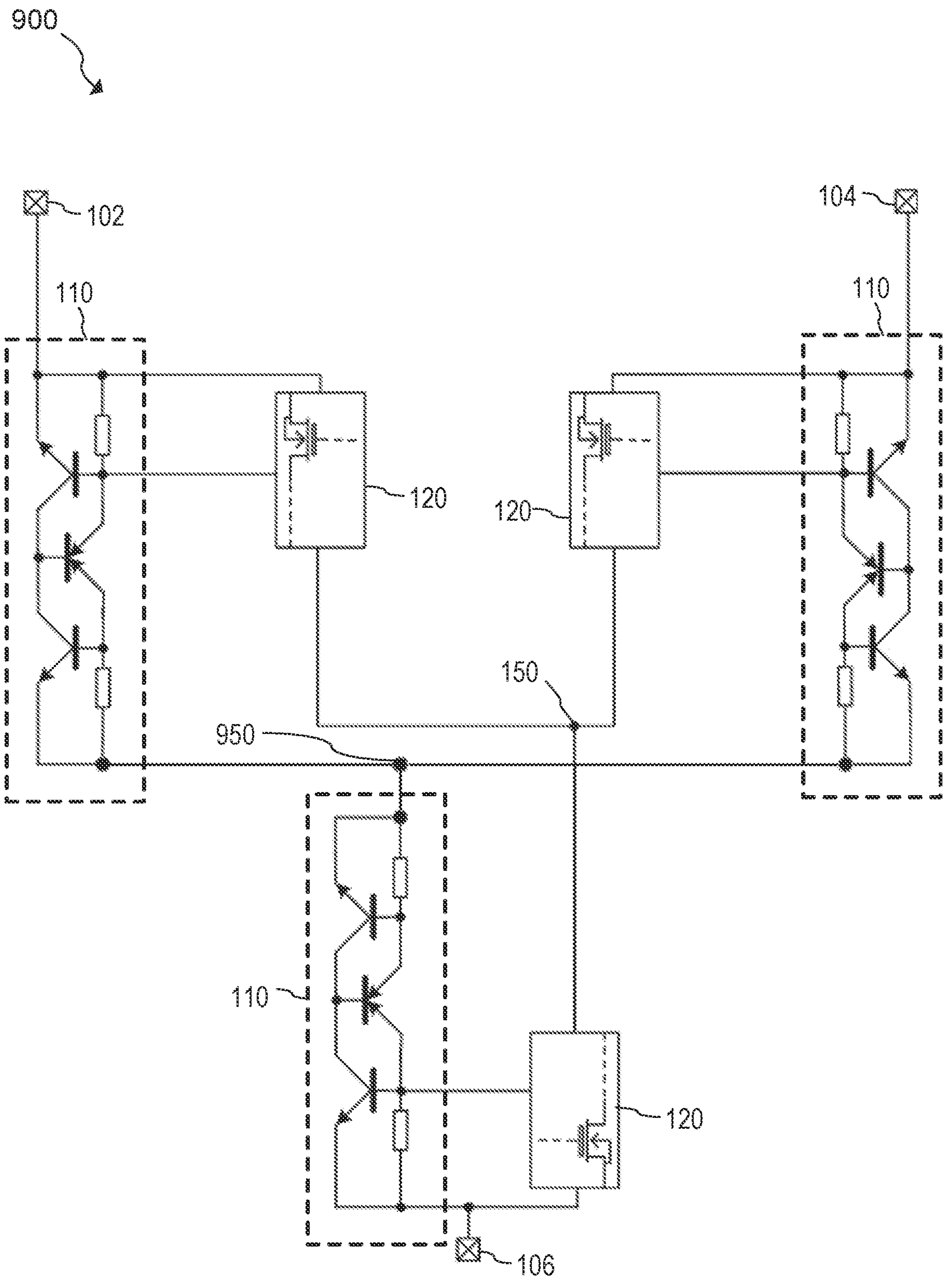

FIG. 9 illustrates an ESD protection circuit 900 with three bidirectional SCRs 110 arranged in a Y-shaped network like the active clamp circuits 120, in accordance with some embodiments. In the ESD protection circuit 900 (also referred to as a star/star configuration), each bidirectional SCR 110 is coupled between a central node 950 and one of the first node 102, the second node 104, and the third node 106. This forms three respective conductive paths between each pair of the first node 102, the second node 104, and the third node 106, each conductive path of which passes through the central node 950 and two of the bidirectional SCRs 110. This is analogous to the arrangement of the active clamp circuits 120 between the star node 150 and one of the first node 102, the second node 104, and the third node 106. The arrangement of the ESD protection circuit 900 allows for the use of two stacked bidirectional SCRs 110 between each pair of the first node 102, the second node 104, and the third node 106, while using less layout area than the stacked SCRs of the ESD protection circuits 700 and 800.

Figure 10:
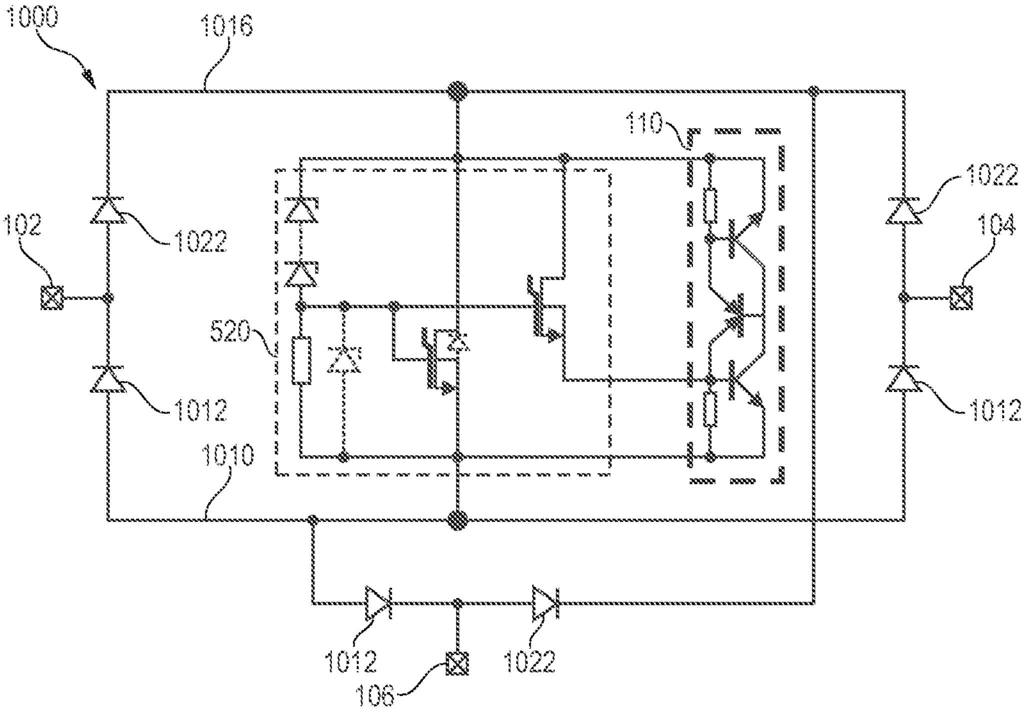
Figure 11:
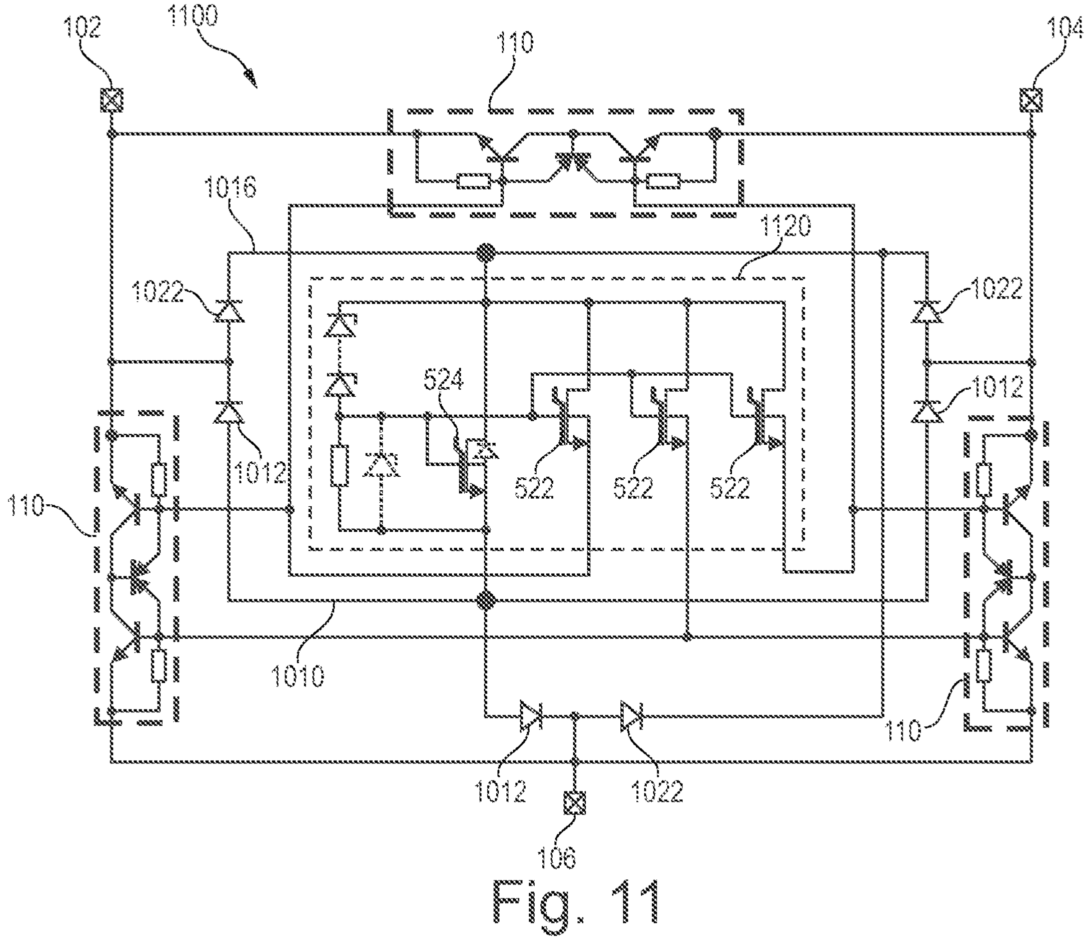

FIGS. 10 and 11 show embodiments of a multi-way ESD clamp with rectifier diodes supplying an ESD bus. This allows for the use of fewer devices (such as SCRs and active clamps) with a possible tradeoff of using more layout space and wiring effort.

FIG. 10 illustrates an ESD protection circuit 1000 including one active clamp circuit 520 and one SCR, in accordance with some embodiments. In the illustrated example, the SCR is a bidirectional SCR 110; however, in some embodiments the SCR is a unidirectional SCR as the SCR will be used in only one polarity. An ESD bus (including a negative ESD bus 1010 and a positive ESD bus 1016) couples the active clamp circuit 520 and the SCR to each of the first node 102, the second node 104, and the third node 106. The negative ESD bus 1010 is coupled to each of the first node 102, the second node 104, and the third node 106 through a respective rectifier diode 1012, and the positive ESD bus 1016 is coupled to each of the first node 102, the second node 104, and the third node 106 through a respective rectifier diode 1022. When an ESD event occurs, the rectifier diodes carry the entire ESD current to the active clamp circuit 520, which then triggers the SCR (e.g., the bidirectional SCR 110) to carry the ESD current when a trigger current $I_{t1}$ a trigger voltage $V_{t1}$ are reached, as described above with respect to FIG. 2.

FIG. 11 illustrates an ESD protection circuit 1100 including one active clamp circuit 1020 and three bidirectional SCRs 110, in accordance with some embodiments. A first bidirectional SCR 110 is coupled between the first node 102 and the second node 104 and forms a first conduction path between them, a second bidirectional SCR 110 is coupled between the second node 104 and the third node 106 and forms a second conduction path between them, and a third bidirectional SCR 110 is present between the first node 102 and the third node 106 and forms a third conduction path between them.

The active clamp circuit 1020 is coupled through an ESD bus (including a negative ESD bus 1010 and a positive ESD bus 1016) to each of the first node 102, the second node 104, and the third node 106. The active clamp circuit 1020 is similar to the active clamp circuit 520 (see above, FIG. 5) but with three parallel trigger transistors 522 to provide triggering to each of the three bidirectional SCRs. The negative ESD bus 1010 is coupled to each of the first node 102, the second node 104, and the third node 106 through a respective rectifier diode 1012, and the position ESD bus 1016 is coupled to each of the first node 102, the second node 104, and the third node 106 through a respective rectifier diode 1022. In contrast with the ESD protection circuit 1000 (see above, FIG. 10), the rectifier diodes of the ESD protection circuit 1100 may carry only the ESD current to the active clamp circuit 1020, as the conduction paths through the three bidirectional SCRs 110 are separate from the ESD bus. As the ESD current for the active clamp circuit 1020 is a fraction of the full ESD current, the rectifier diodes of the ESD protection circuit 1100 may be much smaller than the rectifier diodes of the ESD protection circuit 1000 and also the wiring effort may be smaller. Additionally, there may be no loss in gate-source voltage Vgs because the source current of the shunt transistor 524 is conducted over one of the rectifier diodes 1012 or 1022, while the current of each of the trigger transistors 522 is conducted over one base-emitter diode of a respective bidirectional SCR 110.

Both of the ESD protection circuit 1000 and the ESD protection circuit 1100 have an advantageous low capacitive loading of the ESD bus lines due to the use of rectifier diodes in both embodiments. This may be due to any other ESD circuitry (e.g. MOS devices with their relatively large parasitic capacitances) being coupled in series after these rectifier diodes (with their relatively small parasitic capacitances).

FIGS. 12A, 12B, 12C, and 13-18 illustrate various cross-sectional and top views of structures comprising bidirectional SCRs, in accordance with some embodiments. The bidirectional SCRs of FIGS. 12A, 12B, 12C, and 13-18 may be used in any suitable combinations in the ESD protection circuits illustrated above in FIGS. 4-11.

Figure 12A:
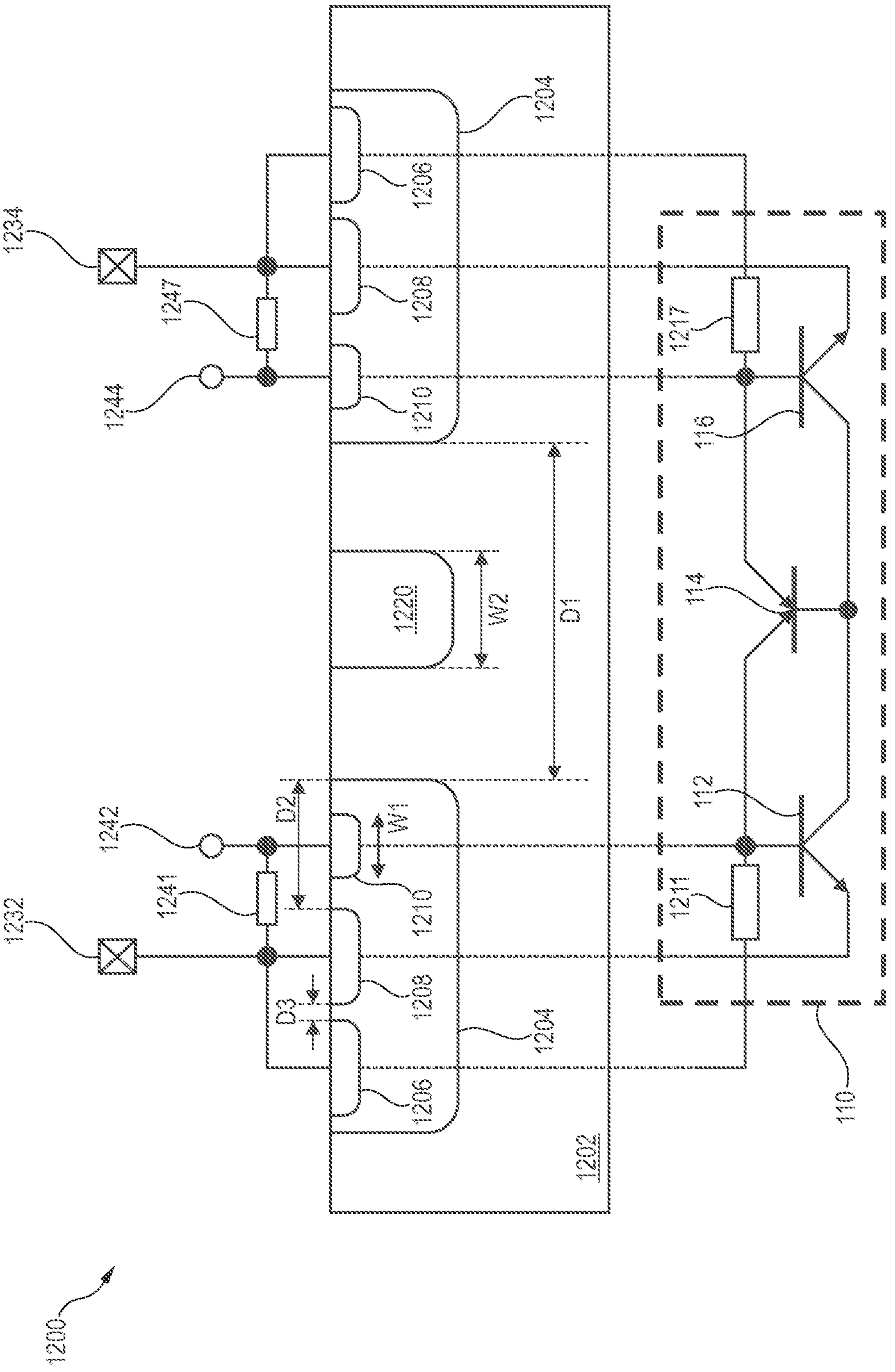
FIG. 12A illustrates a cross-sectional view of an SCR, in accordance with some embodiments.

FIG. 12A illustrates a cross section of a bidirectional SCR 1200 that may be fabricated in, for example, a bulk CMOS process. The bidirectional SCR 1200 may be used as a bidirectional SCR 110 in the embodiments of any of FIGS. 1 and 4-11. As shown in FIG. 12A, the bidirectional SCR 1200 is formed by a first p-well region 1204 and a second p-well region 1204 (also referred to as well regions) disposed in an n-doped region 1202. In some embodiments, the first p-well region 1204 and the second p-well region 1204 are separated by a first distance D1 in a range of 0.5 μm to 10 μm.

A first p-type anode region 1206 and a first n-type cathode region 1208 (also referred to as electrode regions or diffusion regions) are disposed in the first p-well region 1204, and a second p-type anode region 1206 and a second n-type cathode region 1208 are disposed in the second p-well region 1204. In some embodiments, the first n-type cathode region 1208 is between the first p-type anode region 1206 and the second p-well region 1204, and the second n-type cathode region 1208 is between the second p-type anode region 1206 and the first p-well region 1204. The first n-type cathode region 1208 may be separated from an edge of the first p-well region 1204 that is closest to the second p-well region 1204 by a second distance D2 in a range of 0.3 μm to 5.0 μm. The first p-type anode region 1206 and the first n-type cathode region 1208 may be separated by a distance D3 in a range of 0.1 μm to 1.0 μm. The p-type anode regions 1206 may have higher concentrations of a p-type dopant than the p-well regions 1204, and the n-type cathode regions 1208 may have higher doping concentrations than the p-well regions 1204.

A first p-doped tap region 1210 (also referred to as a tap region or a p-tap) is disposed in the first p-well region 1204, and a second p-doped tap region 1210 (also referred to as a tap region or a p-tap) is disposed in the second p-well region 1204. The p-doped tap regions 1210 may be used for trigger current injection and for control of holding voltage. In various embodiments, p-doped tap regions 1210 have higher concentrations of a p-type dopant than the p-well regions 1204. A longitudinal sidewall of the first p-doped tap region 1210 may be aligned with a longitudinal sidewall of the first p-well region 1204, and a longitudinal sidewall of the second p-doped tap region 1210 may be aligned with a longitudinal sidewall of the second p-well region 1204. In some embodiments, the first p-doped tap region 1210 has a first width W1 in a range of 0.1 μm to 4.0 μm.

In some embodiments, a first n-well region 1220 is disposed in the n-doped region 1202 between the first p-well region 1204 and the second p-well region 1204. The first n-well region 1220 has a higher concentration of an n-type dopant than the n-doped region 1202. The first n-well region 1220 may have a first width W2 in a range of 0.5 μm to 5.0 μm.

For the purpose of illustration, FIG. 12A is annotated to show a representative bidirectional SCR 110 (see above, FIG. 4) superimposed over the semiconductor cross section. As such, it can be seen that the doped regions of the semiconductor structure form various transistors. The first n-type cathode region 1208, the first p-well region 1204, and the n-doped region 1202 form the first transistor 112. In some embodiments, the first transistor 112 further comprises the first p-doped tap region 1210. The first p-well region 1204, the n-doped region 1202, and the second p-well region 1204 form the second transistor 114. In some embodiments, the second transistor 114 further comprises the first n-well region 1220 (if present). The second n-type cathode region 1208, the second p-well region 1204, and the n-doped region 1202 form the third transistor 116. In some embodiments, the first transistor 112 further comprises the second p-doped tap region 1210. The well resistance of the first p-well region 1204 is represented by resistor 1211, and the well resistance of the second p-well region 1204 is represented by resistor 1217.

In some embodiments, the first transistor 112 and the third transistor 116 are NPN transistors and the second transistor 114 is a PNP transistor. However, in other embodiments the polarities of the dopants of the bidirectional SCR 1200 are reversed, so that the first transistor 112 and the third transistor 116 are PNP transistors and the second transistor 114 is an NPN transistor.

Terminal 1232 may be coupled to a high potential (e.g., a signal line or supply potential such as the first node 102; see above, FIG. 1) and terminal 1234 may be coupled to a low potential (e.g., a power supply node or ground such as the second node 104; see above, FIG. 1). Terminal 1232 is coupled to the first p-type anode region 1206 and the first n-type cathode region 1208, and terminal 1234 is coupled to the second p-type anode region 1206 and the second n-type cathode region 1208. Terminal 1232 is further coupled to trigger terminal 1242 across a resistor 1241, and terminal 1234 is further coupled to trigger terminal 1244 across a resistor 1247. The resistors 1241 and 1247 may be, e.g., external parallel resistors.

When an ESD event occurs between terminals 1232 and 1234, the bidirectional SCR 1200 is in an off state until it is triggered through a trigger signal. Triggering of the bidirectional SCR 1200 is accomplished by providing a (positive) base-emitter current into one of the first transistor 112 or the third transistor 116 through trigger terminals 1242 and 1244, which may be coupled to trigger outputs (such as from a trigger circuit, active clamp circuit, or the like; see above, FIG. 4). A trigger current source (e.g., an active clamp circuit 120; see above, FIG. 4) starts to inject a current into the bidirectional SCR 1200 at a pre-determined threshold voltage level (on-voltage $V_{on}$) which is above the supply voltage $V_{supply}$ and above the absolute maximum rating voltage $V_{AMR}$. At a pre-determined trigger IV-point (trigger voltage $V_{t1}$, trigger current $I_{t1}$), the bidirectional SCR 1200 triggers and the voltage snaps back from the trigger voltage $V_{t1}$ to the holding voltage $V_h$. The bidirectional SCR 1200 provides a discharge shunt path for up to very high current levels.

In an example where terminal 1232 is at a high potential and terminal 1234 is at ground, the trigger current injected at trigger terminal 1244 will forward-bias the base-emitter junction of the transistor 116. A regenerative SCR mechanism begins with the mutual base-biasing of the base of the transistor 114 being pulled low and the base of the transistor 116 additionally being pulled high. A high ESD current is thereby provided with a low-ohmic path from terminal 1232 across the first p-type anode region 1206 and the first p-well region 1204 and further across the structure to the terminal 1234. The junction from the first p-well region 1204 to the n-doped region 1202 works as a forward biased diode and is equivalent to a path across the resistor 1211 and the emitter-base of the second transistor 112. Additionally, the resistor 1211 may be subject to desirable resistance lowering due to the conductivity modulation effect from the forward biased diode of the junction of the first p-well region 1204 and the n-doped region 1202. A large portion of the ESD current may leave the structure as an emitter current of the transistor 116 through the second n-type cathode region 1208 coupled to the terminal 1234. A smaller portion of the ESD current may flow through the resistor 1217 to the terminal 1234, and a very minor portion of the ESD current may flow through the resistor 1247 to the terminal 1234.

Although the above example of an ESD event describes current flowing across the bidirectional SCR 1200 from terminal 1232 (at a high potential) to terminal 1234 (at a low potential), the bidirectional SCR 1200 is symmetric and may operate with current flowing in the opposite direction. For example, in an ESD event where terminal 1232 is at a low potential and terminal 1234 is at a low potential, current will flow across the bidirectional SCR 1200 in the opposite direction from terminal 1234 to terminal 1232.

The regenerative SCR mechanism of the bidirectional SCR 1200 may result in a high conductivity at a low voltage drop. The initial trigger current provided by an external trigger current source (e.g., through the trigger terminal 1242) is no longer needed to maintain conduction due to the regenerative effect inside the SCR. Because the terminal voltage at the terminal 1232 is lowered by the snapback effect, the external trigger current source may cease to provide current after the snapback effect, but the bidirectional SCR 1200 will continue to operate in a self-sustaining manner due to the regenerative mechanism.

In various embodiments, a first p-doped tap region 1210 is placed laterally between the first n-type cathode region 1208 and the n-doped region 1202, and a second p-doped tap region 1210 is placed laterally between the second n-type cathode region 1208 and the n-doped region 1202. In other words, the first p-doped tap region 1210 is placed close to and reaching inside the base region of the first transistor 112 and the second p-doped tap region 1210 is placed close to and reaching inside the base region of the third transistor 116. The first p-doped tap region 1210 is coupled to the trigger terminal 1242 and the second p-doped tap region 1210 is coupled to the trigger terminal 1244. The first and second p-doped tap regions 1210 are also referred to as dual-purpose taps because they provide both trigger current injection and increased holding voltage. The trigger current injection for first transistor 112 (e.g., a NPN) and third transistor 116 (e.g., another NPN) turn-on is provided through the first and second p-doped tap regions 1210 at a location inside the bidirectional SCR 1200 where the injection may be particularly effective. Increased holding voltage is provided by a high local base doping of the first and second p-doped tap regions 1210. The high doping of the first and second p-doped tap regions 1210 may act as a local recombination center for minority carriers (e.g., electrons). This may reduce the effective bipolar gains of the lateral first transistor 112 and third transistor 116, which may lead to the increased holding voltage.

The first n-well region 1220, if present, can be configured for trigger current injection (see below, FIGS. 15-16). The first n-well region 1220, which (if present) is part of the lateral second transistor 114 (e.g., a PNP), acts a local recombination center for minority carriers (e.g., holes) by having an increased concentration of an n-type dopant over the n-doped region 1202.

The first transistor 112, second transistor 114, and third transistor 116 may operate predominantly as lateral devices. For improved SCR conduction, the first and second p-type anode regions 1206 may be large and coupled through low resistances to the terminals 1232 and 1234, respectively. The sizes of the first and second p-doped tap regions 1210 may be tuned for holding voltage adjustment. For example, larger values of the first width W1 of the first p-doped tap region 1210 and the second distance D2 between the first n-type cathode region 1208 and a sidewall of the first p-well region 1204 across the first p-doped tap region 1210 may lead to a holding voltage increase without compromising a capability for efficient trigger current injection through the first p-doped tap region 1210. The structure may in principle be symmetrical by its general composition and by its coupling to the terminals 1232 and 1234 and the trigger terminals 1242 and 1244. However, the lateral dimensions of the bidirectional SCR 1200 may be adjusted independently according to different electrical parameters required for forward and reverse operation.

Decreasing the distance D3 between the first p-type anode region 1206 and the first n-type cathode region 1208 may contribute an additional increase in the holding voltage because of a more effective shunt between base and emitter inside the lateral first transistor 112 (e.g., an NPN). However, a small value of the distance D3 alone may not be an effective substitute for the recombination center provided by the first p-doped tap region 1210. Additionally, increasing the width W2 of the first n-well region 1220 may help to increase the holding voltage by providing an enlarged recombination region and overall larger base region of the lateral second transistor 114 (e.g., a PNP).

Control of the trigger current may be achieved through the resistors 111 and 117 (see above, FIG. 4), which may also be referred to as base-emitter resistors $R_{BE}$ or shunt resistors. The resistor 111 includes a layout-dependent and technology-dependent well resistance (the resistor 1211) in parallel with a design-controlled external resistor 1241, and the resistor 117 includes a well resistance (the resistor 1217) in parallel with a design-controlled external resistor 1247. The external resistors 1241 and 1241 may be helpful to increase the trigger current and thereby increase robustness of the circuit against false dV/dt triggering from very fast ESD pulses.

Figure 12B:
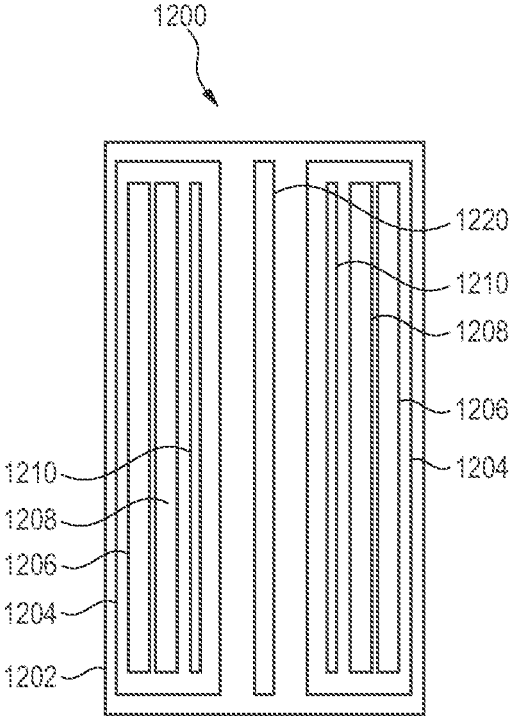
FIGS. 12B-12D illustrate top views of SCRs, in accordance with some embodiments.
Figure 12C:
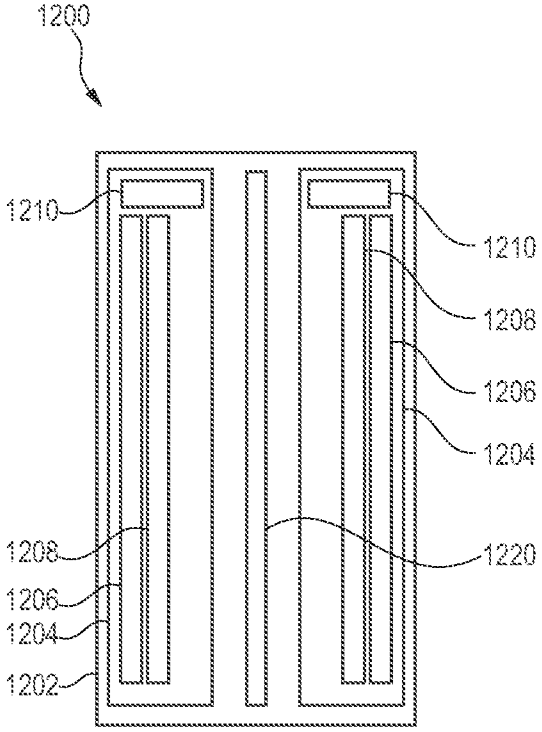
Figure 12D:
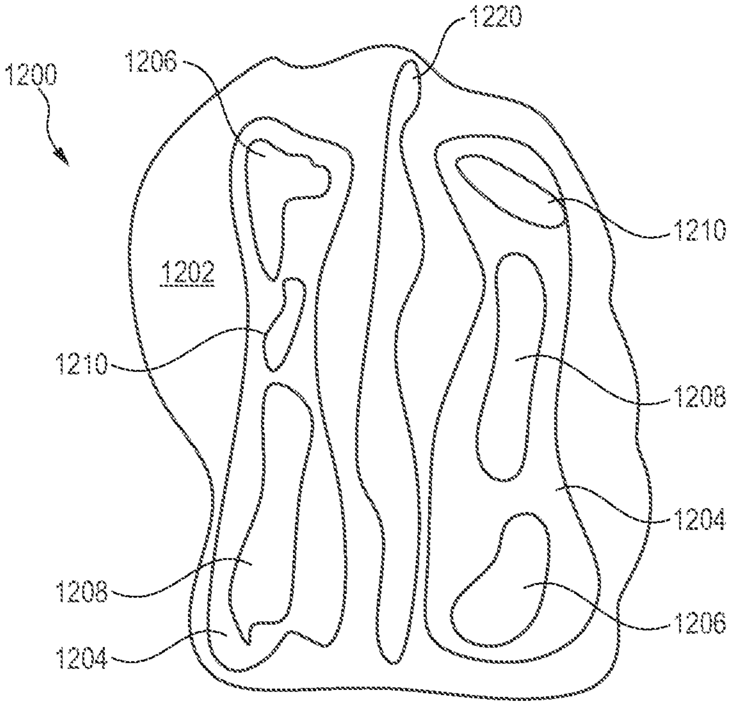

FIGS. 12B-12D illustrate top views of the bidirectional SCR 1200 in accordance with various embodiments. FIG. 12B shows a top view of an embodiment of a bidirectional SCR 1200 in which the p-type anode regions 1206, the n-type cathode regions 1208, and the p-doped tap regions 1210 are longitudinally aligned. The respective p-doped tap regions 1210 in each p-well region 1204 are closest to each other, with each n-type cathode region 1208 being behind each respective p-doped tap region 1210 and each p-type anode region 1206 being behind each respective n-type cathode region 1208. The p-doped tap regions 1210 are placed to enable trigger current injection and to increase holding voltage. However, other respective arrangements may be used.

For example, FIG. 12C shows a top view of an embodiment of a bidirectional SCR 1200 in which the p-type anode regions 1206 and the n-type cathode regions 1208 are longitudinally aligned but the p-doped tap regions 1210 have longitudinal axes perpendicular to the p-type anode regions 1206 and the n-type cathode regions 1208. With these positions, the p-doped tap regions 1210 may enable trigger current injection while the first n-well region 1220 being between the respective p-well regions 1204 allows for increased holding voltage.

As another example, FIG. 12D shows a top view of an embodiment of a bidirectional SCR 1200 in which the shapes and relative locations of the p-doped well regions 1204, the p-type anode regions 1206, the n-type cathode regions 1208, and the p-doped tap regions 1210 are irregular and arbitrary. The first n-well region 1220 may be between the p-well regions 1204 to increase holding voltage while the p-doped tap regions 1210 enable trigger current injection. Any of the embodiments of the bidirectional SCR 1200 illustrated in FIGS. 12B-12D may be used as bidirectional SCRs 110 in the embodiments of FIGS. 1 and 3-11 as suitable.

Figure 13:
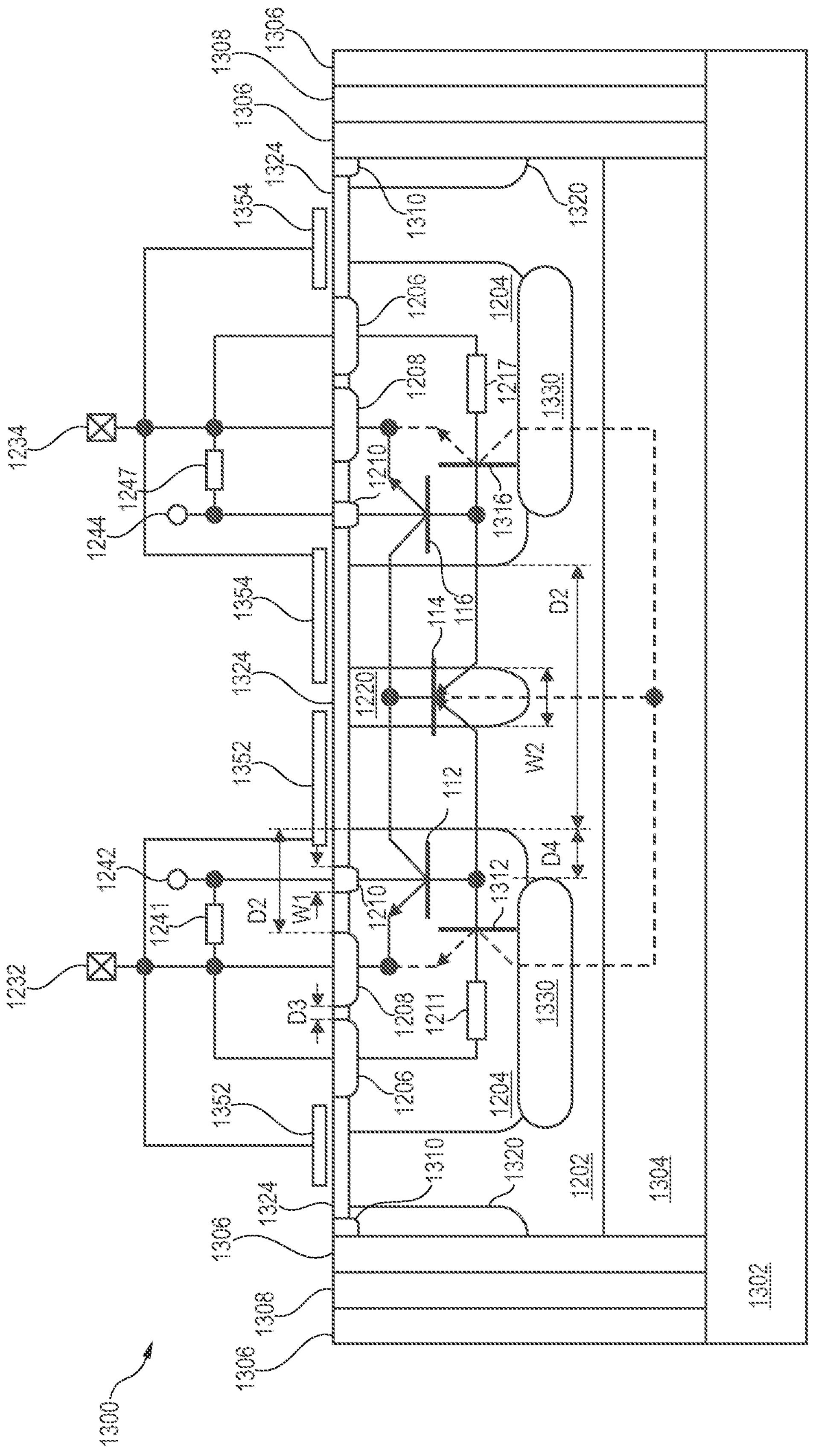
FIG. 13 illustrates a cross-sectional view of an SCR, in accordance with some embodiments.

FIG. 13 illustrates a cross-sectional view of a bidirectional SCR 1300, in accordance with some embodiments. As shown, the bidirectional SCR 1300 is a more detailed diagram of a way to implement the bidirectional SCR 1200 (see above, FIG. 12A). The bidirectional SCR 1300 may be used as a bidirectional SCR 110 in the embodiments of any of FIGS. 1 and 4-11.

An n-buried layer 1304 is over a substrate 1302 (e.g., a p-doped substrate). The n-doped region 1202 is formed (e.g., by epitaxial growth) over the n-buried layer 1304. A deep trench isolation (DTI) region 1306 (e.g., a ring-shaped region of dielectric material such as silicon oxide or the like) surrounds the n-buried layer 1304 and the n-doped region 1202. The DTI region 1306 may extend to the substrate 1302 to accomplish vertical device isolation of the n-doped region 1202, and the n-buried layer 1304 may accomplish vertical device isolation of the n-buried layer 1304 from the substrate 1302. In some embodiments, the DTI region 1306 comprises two concentric rings with a highly p-doped polysilicon-filled region 1308 between them. A shallow trench isolation (STI) region 1324 may cover top surfaces of the n-doped region 1202 and the first and second p-well regions 1204, with the various p-type anode regions 1206, n-type cathode regions 1208, p-doped tap regions 1210, and any other electrodes or diffusion regions extending through the STI region 1324 to allow for electrical coupling. The central first n-well region 1220 may provide an increased breakdown voltage. In some embodiments, the structure of the bidirectional SCR 1300 has a symmetrical composition. However, the actual dimensions of the bidirectional SCR 1300 may be different.

Field plates (e.g., comprising polysilicon) may be present over the structure to suppress possible breakdown of near-surface portions of junctions between the p-well regions 1204 and the n-doped region 1202. The field plates may suppress near-surface junction breakdowns by reducing and pushing the peak electric field deeper into the silicon structure of the bidirectional SCR 1300. This may allow the obtaining of a higher intrinsic breakdown voltage. In some embodiments, a first field plate 1352 is above the n-doped region 1202 and extends over respective sidewalls of the first p-well region 1204 and the first n-well region 1220 (if present), and a second field plate 1354 is above the n-doped region 1202 and extends over respective sidewalls of the second p-well region 1204. The first field plate 1352 may be coupled to the terminal 1232 and the second field plate 1354 may be coupled to the terminal 1234. The field plates 1352 and 1354 may have ring shapes.

Deep p-type implant regions 1330 may be present under the p-well regions 1204, such as at interfaces between the p-well regions 1204 and the n-doped region 1202. The deep p-type implant regions 1330 may be useful for suppressing the parasitic, vertical transistors 1312 and 1316 (e.g., NPN transistors). Reduced trigger voltage caused by the deep p-type implant regions 1330 may be compensated for by recessed edges of the deep p-type implant regions 1330 increasing the trigger voltage again. In some embodiments, the first p-well region 1204 extends over a sidewall of the first deep p-type implant region 1330 in a direction towards the second p-well region 1204 by a fourth distance D4 in a range of 0.2 μm to 4.0 μm.

In some embodiments, a second n-well region 1320 is in the n-doped region 1202 inside the area surrounded by the DTI region 1306 to suppress a leaky parasitic vertical transistor (e.g., a PMOS; not illustrated). The second n-well region 1320 may have a higher concentration of an n-type dopant than the n-doped region 1202. The second n-well region 1320 may be a ring-shaped region that surrounds the first p-well region 1204, the second p-well region 1204, and the first n-well region 1220 (if present). A highly n-doped ring region 1310 may be disposed in the second n-well region 1320 and surround the first p-well region and the second p-well region to further suppress the parasitic vertical transistor. The highly n-doped ring region 1310 may have a higher concentration of an n-type dopant than the second n-well region 1320. The highly n-doped ring region 1310 may extend to a top surface of the bidirectional SCR 1300 between the DTI region 1306 and the STI region 1324.

Figure 14:
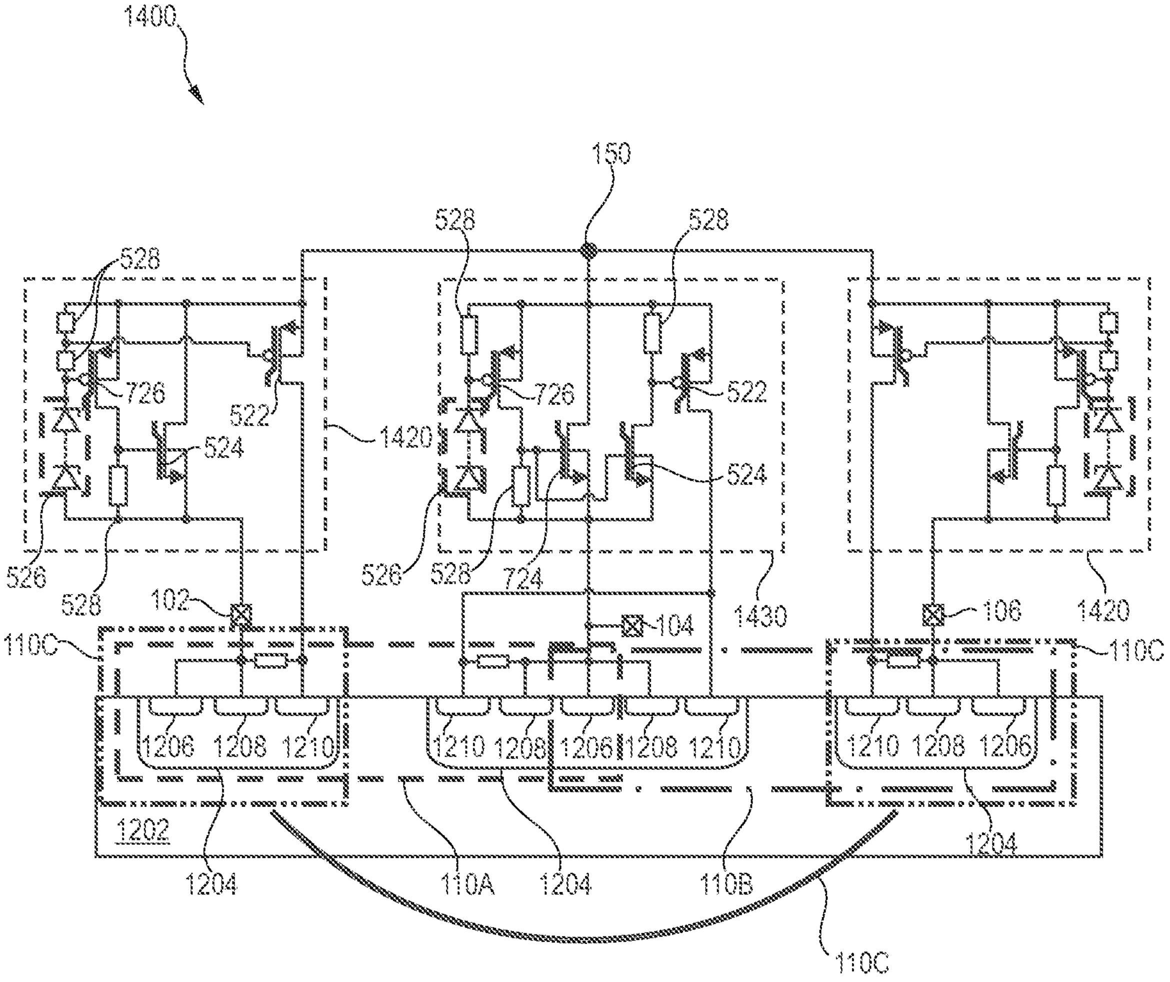
FIG. 14 illustrates a schematic of an ESD protection circuit showing SCRs implemented in a cross-sectional view of a semiconductor structure, in accordance with some embodiments.

FIG. 14 illustrates a schematic of an ESD protection circuit 1400 showing bidirectional SCRs implemented in a cross-sectional view of a semiconductor structure, in accordance with some embodiments. The ESD protection circuit 1400 is similar to the ESD protection circuit 500 (see above, FIG. 5) but with active clamp circuits 1420 and 1430 replacing the active clamp circuits 520. The active clamp circuits 1420, which are coupled along conduction paths between the star node 150 and the first node 102 and the third node 106 (e.g., signal lines such as CANL and CANH), respectively, is similar to the active clamp circuits 520 of FIG. 5 with the addition of respective trigger amplifiers 726 (e.g., PMOS devices) to increase bias and of gate-source resistors 528 coupled to each of the respective trigger transistors 522, the respective shunt transistors 524, and the respective trigger amplifiers 726 to allow for staggered triggering. This staggered triggering enables turn-on of the respective shunt transistors 524 with delayed turn-on of the respective trigger transistors 522, which may allow better utilization of the shunt-transistor-containing active clamp circuits 1420 until the bidirectional SCR is triggered. The active clamp circuit 1430, which is coupled along a conduction path between the star node 150 and the second node 104 (e.g., a power supply or ground) is similar to the active clamp circuits 1420 with the inclusion of an additional trigger buffer 724 (e.g., an NMOS device). The trigger transistors 522 of the active clamp circuits 1420 and the active clamp circuits 1430 may be of PMOS-type to enable full pull-up functionality without loss in gate-source voltage $V_{GS}$ bias.

FIG. 14 further illustrates bidirectional SCRs 110A, 110B, and 110C in a cross-sectional view. The bidirectional SCR 110A corresponds to the bidirectional SCR 110 of FIG. 5 that is coupled along a conduction path between the first node 102 and the second node 104, the bidirectional SCR 110B corresponds to the bidirectional SCR 110 of FIG. 5 that is coupled along a conduction path between the second node 104 and the third node 106, and the bidirectional SCR 110C corresponds to the bidirectional SCR 110 of FIG. 5 that is coupled along a conduction path between the first node 102 and the third node 106. The bidirectional SCRs 110A and 110B make use of symmetry to share the central p-well region 1204 and the p-type anode region 1206 in the center of the central p-well region 1204. The bidirectional SCR 110C includes the left and right p-well regions 1204 and their respective electrode regions, which are coupled together through the n-doped region 1202 as a relatively weak, long-distance parasitic structure. The bidirectional SCRs 110A, 110B, and 110C and the active clamp circuits 1420 and 1430 may be used in any of the ESD protection circuits in the embodiments of any of FIGS. 1 and 4-11.

Figure 15:
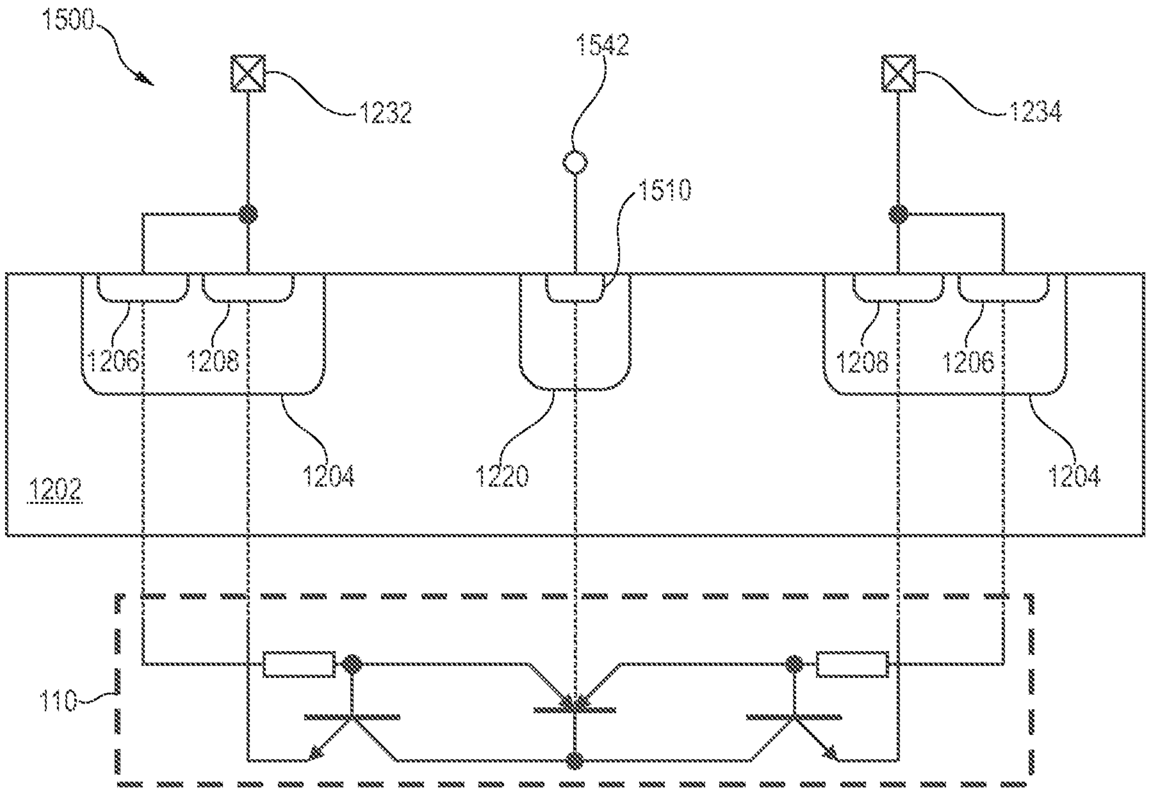
FIGS. 15-16 illustrate cross-sectional views of SCRs, in accordance with some embodiments.
Figure 16:
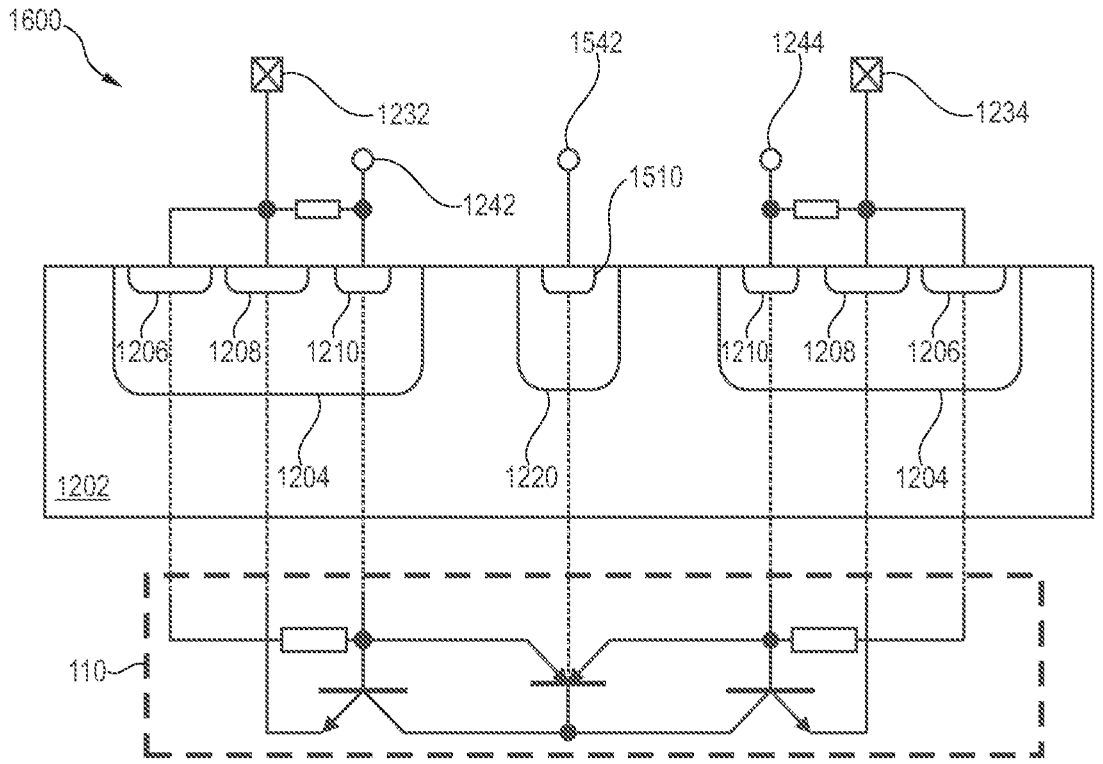

FIGS. 15 and 16 illustrate cross-sectional views of bidirectional SCRs with n-tap triggering, in accordance with some embodiments. FIG. 15 illustrates a cross-sectional view of a bidirectional SCR 1500 that is similar to the bidirectional SCR 1200 (see above, FIG. 12A) with the absence of p-doped tap regions 1210 and the inclusion of an n-doped tap region 1510 in the first n-well region 1220. The n-doped tap region 1510 is coupled to a trigger terminal 1542 and has a higher concentration of an n-type dopant than the first n-well region 1220. Upon receiving a trigger current through the trigger terminal 1542, the potential of the first n-well region 1220, activating the bidirectional SCR 1500 to conduct current from, e.g., the terminal 1232 to the terminal 1234. The higher n-type doping concentration of the n-doped tap region 1510 also acts as an additional recombination region for providing holes to supplement the recombination center already provided by the first n-well region 1220, thereby increasing the holding voltage. The bidirectional SCR 1500 may be used in the n-tap triggered ESD protection circuit 600 (see above, FIG. 6), or in any of the ESD protection circuits of FIGS. 4-5, 7-11, and 14 with n-tap triggering implemented, and the n-doped tap region 1510 and trigger terminal 1542 may be included in the bidirectional SCRs of FIGS. 12A, 13, and 14 to enable n-tap triggering.

FIG. 16 illustrates a cross-sectional view of a bidirectional SCR 1600 that is similar to the bidirectional SCR 1500 (see above, FIG. 15) with first and second p-doped tap regions 1210 included, similar to their presence in the bidirectional SCRs of FIGS. 12A, 13, and 14. As such, the bidirectional SCR 1600 may be either p-tap triggered through the trigger terminals 1242 and 1244 with the trigger terminal 1542 left floating or n-tap triggered through the trigger terminal 1542 with the trigger terminals 1242 and 1244 left floating. The bidirectional SCR 1600 with both p-tap and n-tap triggering enabled may be used in any of the ESD protection circuits of FIGS. 4-5, 7-11, and 14.

Figure 17:
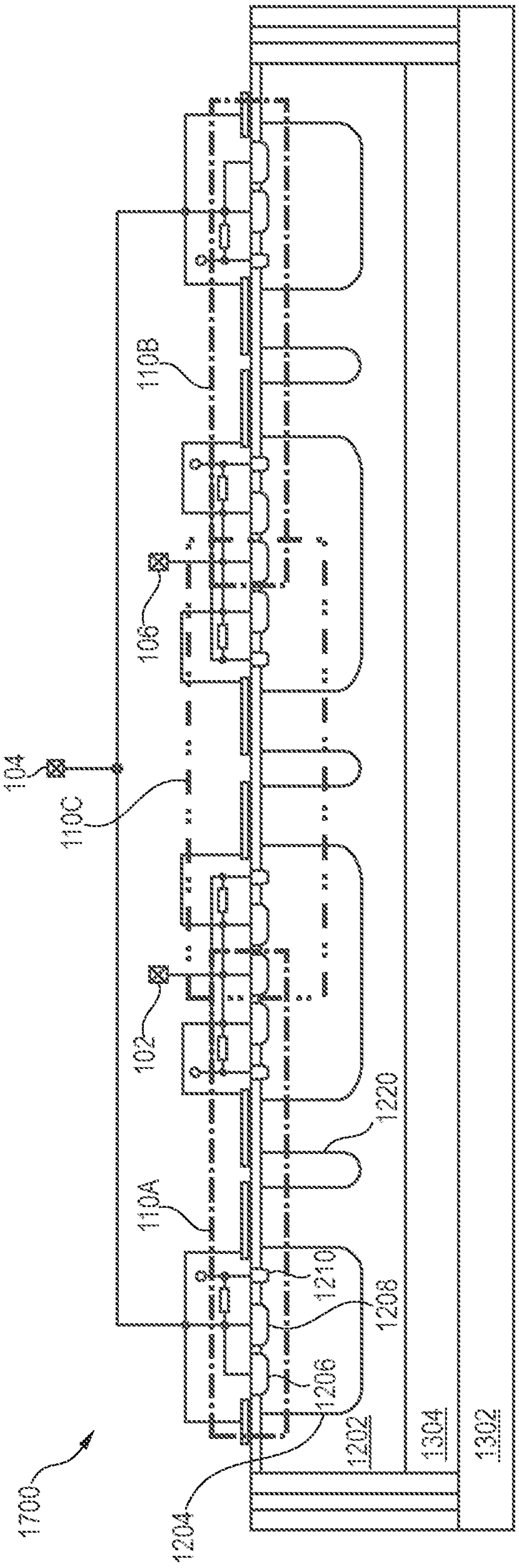
FIGS. 17-18 illustrate cross-sectional views of multiple SCRs implemented in semiconductor structures, in accordance with some embodiments.
Figure 18:
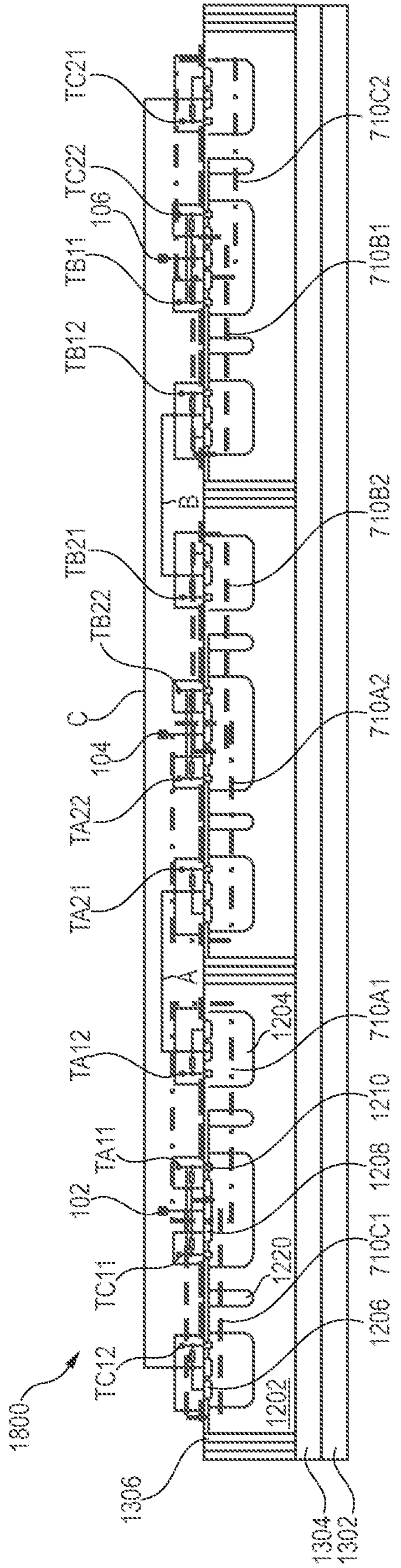

FIGS. 17-18 illustrate cross-sectional views of multiple SCRs implemented in semiconductor structures, in accordance with some embodiments. FIG. 17 shows a cross-sectional view of a semiconductor structure 1700 implementing three bidirectional SCRs 110A, 110B, and 110C in which the third bidirectional SCR 110C is implemented at equal strength as the other two bidirectional SCRs 110A and 110B. This is unlike the bidirectional SCR 110C described above with respect to FIG. 14 that is implemented by a coupling through the n-doped region 1202 as a relatively weak, long-distance parasitic structure. In FIG. 17, the bidirectional SCRs 110A, 110B, and 110C are implemented by making use of symmetry to share central p-well regions 1204 and p-type anode regions 1206 in the centers of the respective central p-well regions 1204. The second node 104 (e.g., a ground) is coupled by two conductive paths to each of the first bidirectional SCR 110A and the second bidirectional SCR 110B. The semiconductor structure 1700 with the three bidirectional SCRs 110A, 110B, and 110C may be used in any of the ESD protection circuits in the embodiments of any of FIGS. 1 and 4-11.

FIG. 18 shows a cross-sectional view of a semiconductor structure 1800 implementing six stacked bidirectional SCRs 710A1, 710A2, 710B1, 710B2, 710C1, and 710C2, in accordance with some embodiments. The six stacked bidirectional SCRs of the semiconductor structure 1800 may be used in the ESD protection circuits 700 and 800 (see above, FIGS. 7-8) with stacked bidirectional SCRs. In particular, the six stacked bidirectional SCRs illustrated in FIG. 17 are equivalent to the three SCR stacks 710 described above with respect to FIG. 7. The correspondence between FIGS. 7 and 18 is shown by internal node A between bidirectional SCRs 710A1 and 710A2, internal node B between bidirectional SCRs 710B1 and 710B2, and internal node C between bidirectional SCRs 710C1 and 710C2. The trigger terminals TA11, TA12, TA21, TA22, TB11, TB12, TB21, TB22, TC11, TC12, TC21, and TC22 are used to couple to active clamp circuits 720 (see above, FIG. 7). However, the six stacked bidirectional SCRs of FIG. 18 may also be used to implement the single triggered stacked bidirectional SCRs of the ESD protection circuit 800 (see above, FIG. 8) by leaving half of the trigger terminals floating. In some embodiments, SCRs that do not operate simultaneously (e.g., bidirectional SCRs 710A1 and 710C1) are placed in a same n-doped region 1202, thereby. This may save layout area through the sharing of a p-well region 1204 and a central p-doped anode region 1206 and allowing the omission of DTI regions 1306 between the bidirectional SCRs 710A1 and 710C1.

Figure 19:
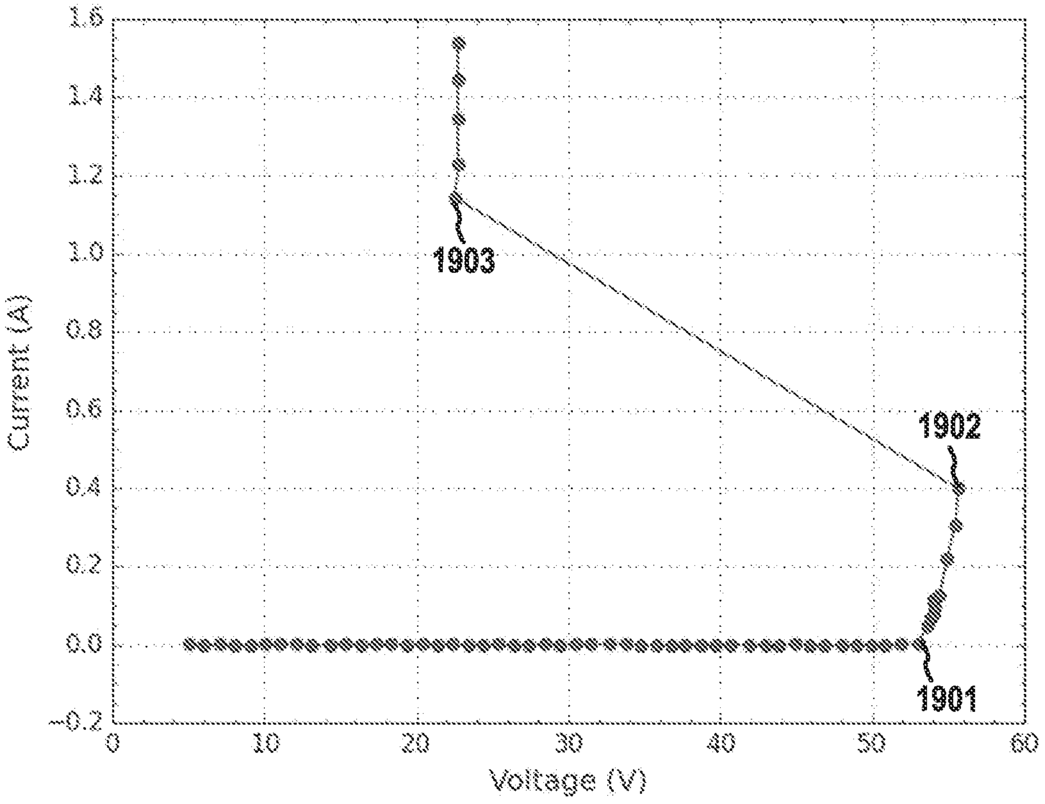
FIG. 19 illustrates a graph showing the performance of an ESD protection circuit, in accordance with some embodiments.

FIG. 19 illustrates a graph of experimental results from a transmission line pulser (TLP) of current versus voltage demonstrating the performance of ESD protection circuit with an active clamp and an SCR (e.g., the ESD protection circuit 400; see above, FIG. 4) experiencing an ESD event. The plotting is done based on rectangular pulses of 100 ns duration and the data is extracted as average values from a time window of 60 ns to 80 ns. After the ESD event begins, current remains at zero while voltage increases. At point 1901, an on-voltage $V_{on}$ of about 53 V is reached and the active clamp begins to conduct current. Voltage and current continue to rise until point 1902, the trigger IV-point, is reached at a trigger current $I_{t1}$ of about 0.4 A and a trigger voltage $V_{t1}$ of about 56 V. The SCR is triggered and begins to conduct the ESD current, leading to a snapback effect from point 1902 to point 1903 as voltage drops while current continues to increase as it is shunted to the SCR. At point 1903, a holding voltage $V_h$ of about 23 V is reached and the SCR continues to conduct virtually all of the rising ESD current while the ESD event lasts, up to much higher current levels that are not illustrated here due to the focus on the trigger region.

Figure 20A:
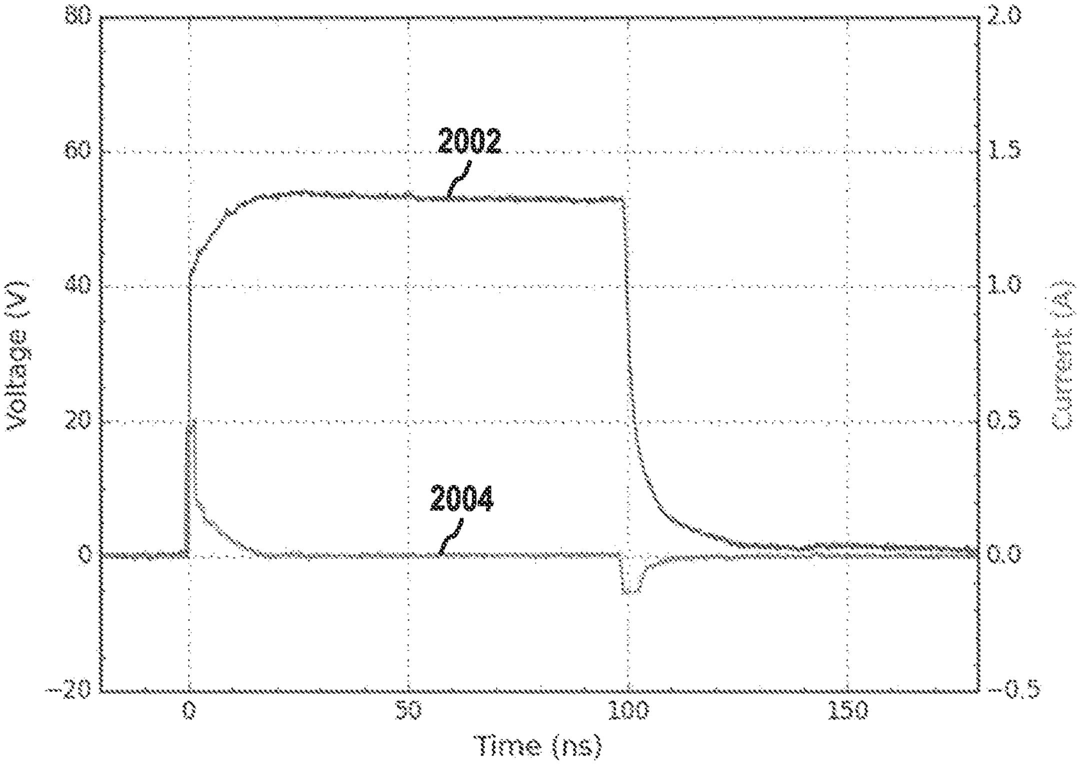
FIGS. 20A-20C illustrate waveforms showing the performance of an ESD protection circuit, in accordance with some embodiments.
Figure 20B:
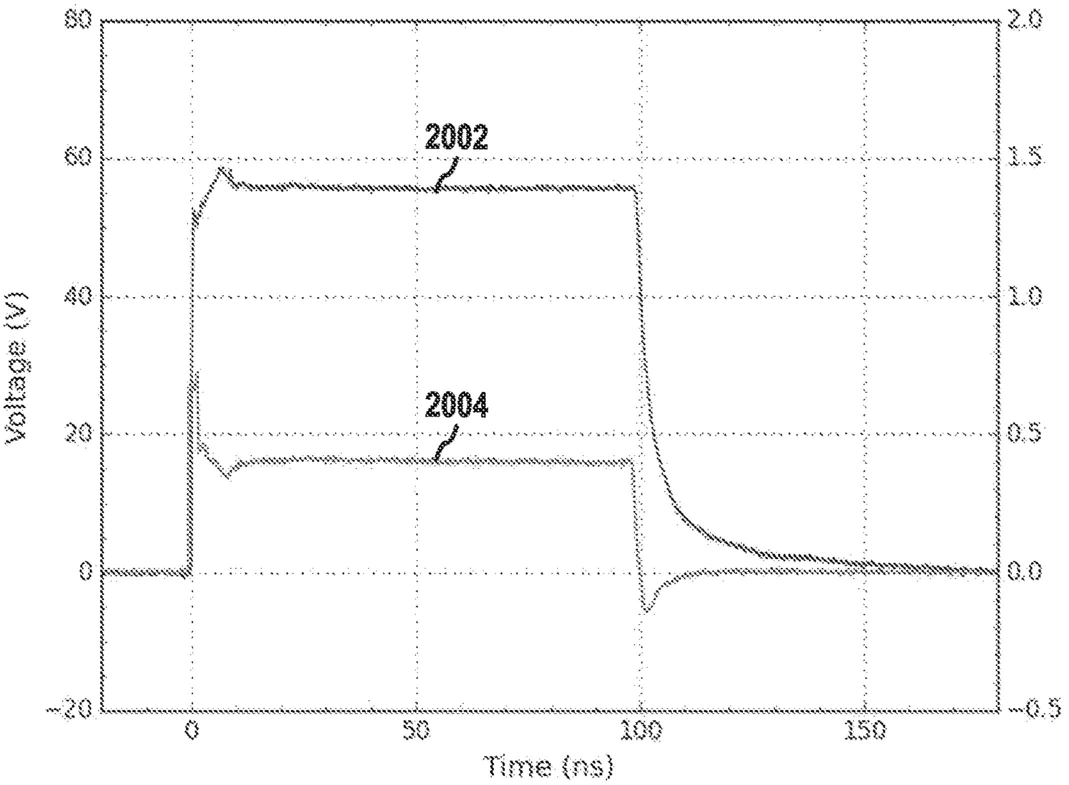
Figure 20C:
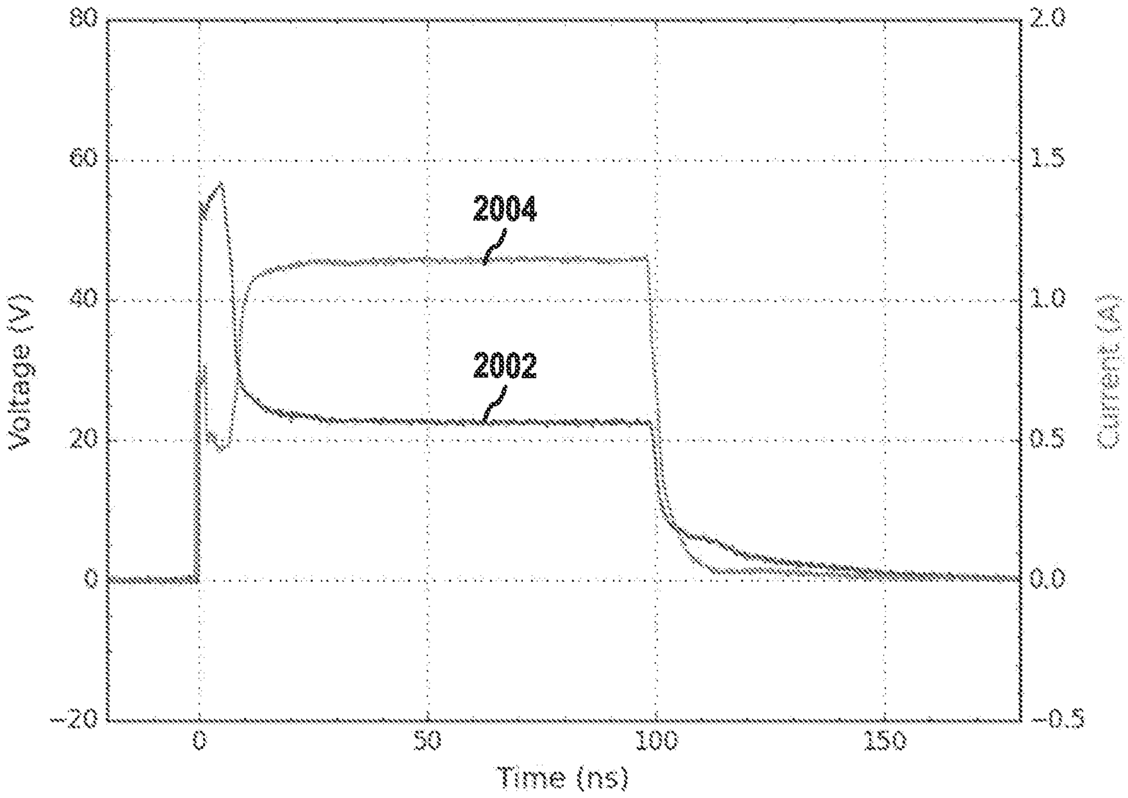

FIGS. 20A-20C illustrate experimental results of transient waveforms from a transmission line pulser (TLP) showing conduction in an ESD protection circuit with an active clamp and an SCR, in accordance with some embodiments. Trace 2002 is the voltage transient waveform in an ESD protection circuit with an active clamp and an SCR (e.g., an ESD protection circuit 500 with an active clamp circuit 520 and a bidirectional SCR 110; see above, FIG. 5) and trace 2004 is the current transient waveform in the ESD protection circuit. The TLP provides a pulse of about 100 ns in length.

FIG. 20A shows the voltage and current in the ESD protection circuit without the active clamp turning on and without triggering of the SCR. At about 0 ns, the voltage increases asymptotically to about 55 V over about 25 ns and the current increases from 0 A to about 0.5 A in a short, dynamic spike that falls back to 0 A in about 20 ns. The spike may be due to a charging of parasitic capacitors and short transient biasing of a shunt transistor (e.g., a BigFET) gate by drain-gate coupling. The current falls back to zero because the active clamp remains non-conductive (in other words, in a blocking state). At 100 ns, the pulse ends and the voltage drops back to 0 V.

FIG. 20B shows the voltage and current in the ESD protection circuit with the active clamp turning on but without triggering of the SCR. At about 0 ns, the voltage increases to about 55 V as determined by the active clamp. The current increases in a short, dynamic spike similar to the spike shown in FIG. 20A and then settles at about 0.4 A or greater as the active clamp conducts the current but without any conduction by the SCR. At 100 ns, the pulse ends and the voltage and current drop back to 0 V and 0 A, respectively.

FIG. 20C shows the voltage and current in the ESD protection circuit with the active clamp turning on and a subsequent triggering of the SCR to conduct the current. The behavior from 0 ns to about 5 ns is similar to FIG. 20A with a high voltage reached of about 55 V as determined by the active clamp and a short, dynamic current spike that drops below 0.5 A. At about 5 ns, the active clamp triggers the SCR and the SCR begins to conduct. This produces an asymptotic drop of voltage to about the holding voltage of 22 V and a rise in current to over 1.1 A due to current flowing through the SCR. The active clamp stops conducting after the SCR turns on due to the collapse in voltage. At 100 ns, the pulse ends and the voltage and current drop back to 0 V and 0 A, respectively.

Figure 21:
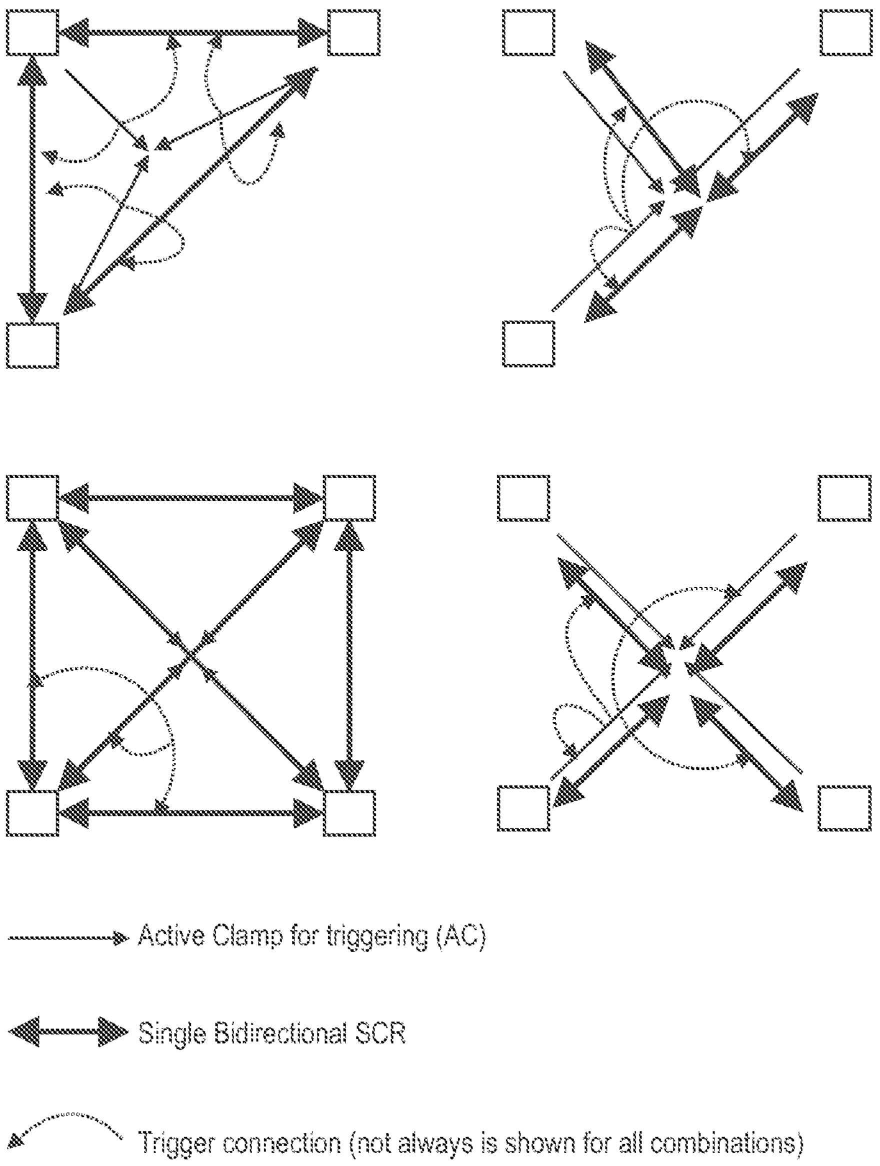
FIG. 21 illustrates various architectures for multi-way ESD protection circuits, in accordance with some embodiments.

FIG. 21 illustrates various architectures for multi-way ESD protection circuits, in accordance with some embodiments. Square boxes represent pads that may be coupled to signal lines, supply voltages, power supplies, grounds, or other nodes at different potentials. Single-headed solid arrows represent active clamps for conducting initial discharges between pads and triggering SCRs, double-headed solid arrows represent single bidirectional SCRs, and dashed arrows represent trigger connections from the active clamps to the SCRs. Not all trigger connections are illustrated by FIG. 21 for every active clamp-to-SCR coupling.

The top left drawing of FIG. 21 illustrates three pads, each coupled to a respective active clamp that are coupled to each other at a central star node. Three bidirectional SCRs are each coupled between each respective pair of pads in a delta arrangement. This is equivalent to the ESD protection circuits illustrated in FIGS. 1 and 4-8.

The top right drawing of FIG. 21 also illustrates three pads, each coupled to a respective active clamp that are coupled to each other at a first star node. Each of three bidirectional SCRs are also coupled between each respective pad and a second star node. This is equivalent to the ESD protection circuit of FIG. 9. This arrangement may be useful in cases of high holding voltage requirements as two bidirectional SCRs are stacked in series between each pair of pads.

The bottom left drawing of FIG. 21 illustrates four pads, each coupled to a respective active clamp that are coupled to each other at a central star node in a star-like configuration. Six bidirectional SCRs are used to couple each two-pad combination of the four pads to each other in a web-like configuration.

The bottom right drawing of FIG. 21 also illustrates four pads, each coupled to a respective active clamp that are coupled to each other at a first star node in a star-like configuration. Each of four bidirectional SCRs are also coupled between each respective pad and a second star node. Like the top right drawing, this arrangement may be useful in cases of high holding voltage requirements as two bidirectional SCRs are stacked in series between each pair of pads.

Although FIG. 21 illustrates multi-way ESD protection circuits with three and four pads, any number of pads or nodes, such as five or more pads, may be protected by ESD circuits with suitable numbers of active clamp circuits coupled together at a star node and bidirectional SCRs in web-like or star-like configurations, and all such architectures are within the scope of the disclosed embodiments. Use of the various star-like and/or web-like arrangements for active clamps and bidirectional SCRs may provide significant savings in occupied layout space that increases with the number of pads coupled by the ESD protection circuits.

Figure 22:
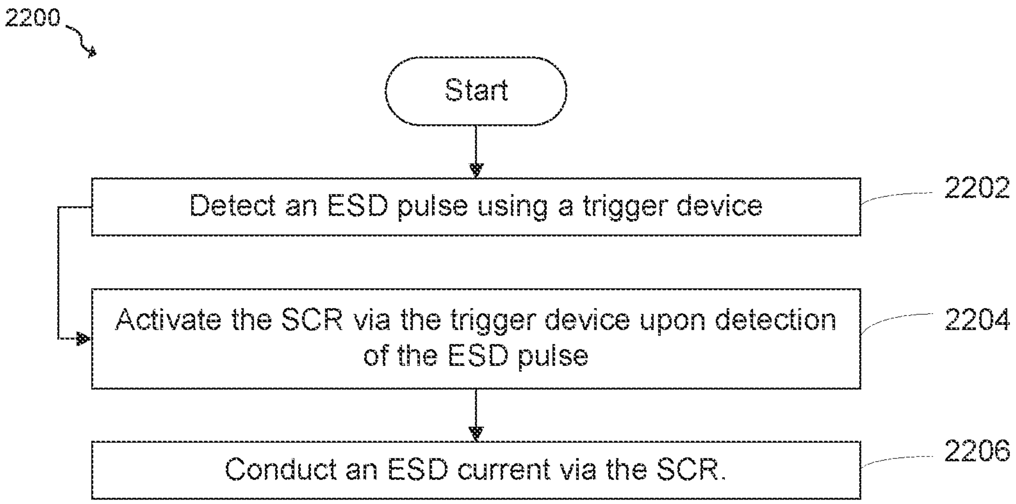
FIGS. 22-23 illustrate flowcharts of methods for ESD protection, in accordance with some embodiments.

FIG. 22 illustrates a block diagram of a method 2200 of operating an SCR ESD device, in accordance with some embodiments. For example, method 2200 may be used to provide protection to a circuit using a silicon controlled rectifier (SCR) comprising a first p-well region, a second p-well region, and an n-doped region, the first p-well region coupled to a first trigger terminal via a first p-doped tap region disposed in the first p-well region, the first p-doped tap region having a higher concentration of a p-type dopant than the first p-well region, the second p-well region coupled to a second trigger terminal via a second p-doped tap region disposed in the second p-well region, and the second p-doped tap region having a higher concentration of a p-type dopant than the second p-well region.

In step 2202, an ESD pulse is detected using a trigger device. The trigger device may be part of the first clamp circuit, the second clamp circuit, or the third clamp circuit, such as active clamp circuits 120 described above with respect to FIG. 1, active clamp circuits 520 described above with respect to FIG. 5, active clamp circuits 620 described above with respect to FIG. 6, active clamp circuits 720 described above with respect to FIG. 7, active clamp circuits 1420 and active clamp circuit 1430 described above with respect to FIG. 14, the like, or a combination thereof.

In step 2204, the SCR is activated by the trigger device upon detection of the ESD pulse. The SCR may be a bidirectional SCR 110 as described above with respect to FIG. 5, a bidirectional SCR 1200 as described above with respect to FIG. 12A-12D, a bidirectional SCR 1300 as described above with respect to FIG. 13, a bidirectional SCR 110A, 110B, or 110C as described above with respect to FIG. 14, a bidirectional SCR 1600 as described above with respect to FIG. 16, bidirectional SCRs 110A, 110B, or 110C as described above with respect to FIG. 17, bidirectional SCRs 710A1, 710A2, 710B1, 710B2, 710C1, or 710C2 as described above with respect to FIG. 18, the like, or a combination thereof. In step 2206, an ESD current is conducted through the SCR.

Figure 23:
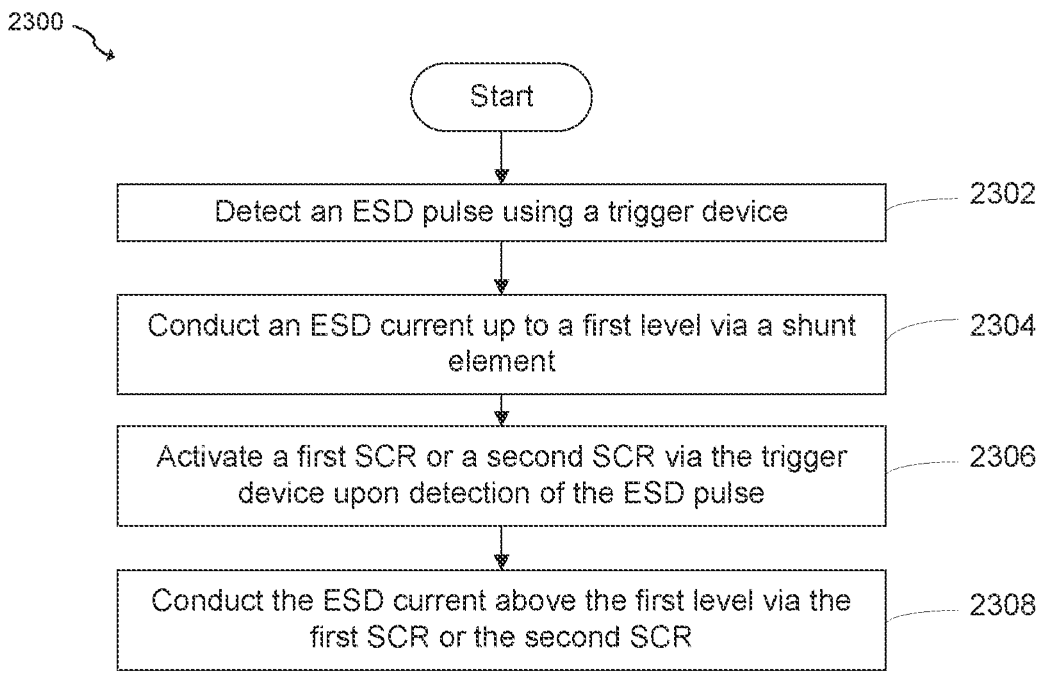

FIG. 23 illustrates a block diagram of a method 2300 of operating an ESD protection circuit, in accordance with some embodiments. For example, method 2300 may be used to provide protection to a circuit using a first silicon controlled rectifier (SCR) having a first conduction path coupled between a first node and a second node, a second SCR having a second conduction path coupled between the second node and a third node, and a first clamp circuit, a second clamp circuit, and a third clamp circuit, wherein the first clamp circuit, the second clamp circuit, and the third clamp circuit are mutually coupled at a star node, the first clamp circuit being coupled to a first control terminal of the first SCR, the first clamp circuit having a third conduction path coupled between the first node and the star node, the second clamp circuit being coupled to a second control terminal of the second SCR, the second clamp circuit having a fourth conduction path coupled between the third node and the star node, and the third clamp circuit being coupled to a third control terminal of the first SCR and a fourth control terminal of the second SCR, and the third clamp circuit having a fifth conduction path coupled between the second node and the star node.

In step 2302, an ESD pulse is detected using a trigger device. The trigger device may be part of the first clamp circuit, the second clamp circuit, or the third clamp circuit, such as active clamp circuits 120 described above with respect to FIG. 1, active clamp circuits 520 described above with respect to FIG. 5, active clamp circuits 620 described above with respect to FIG. 6, active clamp circuits 720 described above with respect to FIG. 7, active clamp circuits 1420 and active clamp circuit 1430 described above with respect to FIG. 14, the like, or a combination thereof. In step 2304, an ESD current up to a first level is conducted by a shunt element (e.g., a transistor such as a shunt transistor 524), as described above with respect to FIG. 1. The shunt element may be part of the first clamp circuit, the second clamp circuit, or the third clamp circuit.

In step 2306, the first SCR or the second SCR are activated by the trigger device upon detection of the ESD pulse. The first SCR or the second SCR may be bidirectional SCRs 110 as described above with respect to FIG. 5, bidirectional SCRs 1200 as described above with respect to FIG. 12A-12D, bidirectional SCRs 1300 as described above with respect to FIG. 13, bidirectional SCRs 110A, 110B, or 110C as described above with respect to FIG. 14, bidirectional SCRs 1500 as described above with respect to FIG. 15, bidirectional SCRs 1600 as described above with respect to FIG. 16, bidirectional SCRs 110A, 110B, or 110C as described above with respect to FIG. 17, bidirectional SCRs 110A1, 110A2, 110B1, 110B2, 110C1, or 110C2 as described above with respect to FIG. 18, the like, or a combination thereof. In step 2308, the ESD current above the first level is conducted through the first SCR or the second SCR.

Embodiments of the present invention are summarized in the following examples. Other embodiments can also be understood from the entirety of the specification and the claims filed herein.

Example 1. A semiconductor device including: a first p-well region and a second p-well region, the first p-well region and the second p-well region being in an n-doped region over a substrate; a first n-type cathode region in the first p-well region; a first p-type anode region in the first p-well region, the first n-type cathode region being between the first p-type anode region and the second p-well region, where the first p-type anode region has a higher concentration of a p-type dopant than the first p-well region; a second n-type cathode region in the second p-well region; a second p-type anode region in the second p-well region, the second n-type cathode region being between the second p-type anode region and the first p-well region, where the second p-type anode region has a higher concentration of the p-type dopant than the second p-well region; a first p-doped tap region in the first p-well region, the first p-doped tap region being between the first n-type cathode region and the second p-well region, the first p-doped tap region having a higher concentration of the p-type dopant than the first p-well region; and a second p-doped tap region in the second p-well region, the second p-doped tap region being between the second n-type cathode region and the first p-well region, the second p-doped tap region having a higher concentration of the p-type dopant than the second p-well region.

Example 2. The semiconductor device of example 1, where the first n-type cathode region and the second n-type cathode region have a first doping concentration, the first p-well region and the second p-well region have a second doping concentration, and the first doping concentration is higher than the second doping concentration.

Example 3. The semiconductor device of one of examples 1 or 2, where the first n-type cathode region and the first p-type anode region are configured to be coupled to a first signal line or supply potential, where the second n-type cathode region and the second p-type anode region are configured to be coupled to a power supply node, where the first p-doped tap region is configured to be coupled to a first trigger output, and where the second p-doped tap region is configured to be coupled to a second trigger output.

Example 4. The semiconductor device of example 3, further including a first n-well region in the n-doped region, the first n-well region being between the first p-well region and the second p-well region, the first n-well region having a higher concentration of an n-type dopant than the n-doped region.

Example 5. The semiconductor device of example 4, further including an n-doped tap region in the first n-well region, the n-doped tap region being coupled to a third trigger terminal, the n-doped tap region having a higher concentration of the n-type dopant than the first n-well region.

Example 6. The semiconductor device of one of examples 1 to 5, further including a second n-well region in the n-doped region, the second n-well region having a higher concentration of an n-type dopant than the n-doped region, the second n-well region surrounding the first p-well region and the second p-well region.

Example 7. The semiconductor device of example 6, further including a highly n-doped ring region in the second n-well region, the highly n-doped ring region having a higher concentration of the n-type dopant than the second n-well region, the highly n-doped ring region surrounding the first p-well region and the second p-well region.

Example 8. The semiconductor device of one of examples 1 to 7, further including a first deep p-type implant region under the first p-well region.

Example 9. The semiconductor device of example 8, where the first p-well region extends over a sidewall of the first deep p-type implant region in a direction towards the second p-well region.

Example 10. The semiconductor device of one of examples 1 to 9, further including a first field plate above the n-doped region, the first field plate extending over respective sidewalls of the first p-well region.

Example 11. The semiconductor device of example 10, further including a second field plate above the n-doped region, the second field plate extending over respective sidewalls of the second p-well region.

Example 12. An ESD protection circuit including: at least one silicon controlled rectifier (SCR) device including: a first p-well region disposed in an n-doped region, the first p-well region coupled to a first trigger terminal via a first p-doped tap region, a longitudinal sidewall of the first p-doped tap region being aligned with a longitudinal sidewall of the first p-well region, the first p-doped tap region having a higher concentration of a p-type dopant than the first p-well region; a second p-well region disposed in the n-doped region, the second p-well region coupled to a second trigger terminal via a second p-doped tap region, a longitudinal sidewall of the second p-doped tap region being aligned with a longitudinal sidewall of the second p-well region, the second p-doped tap region having a higher concentration of the p-type dopant than the second p-well region; a first p-type anode region surrounded by the first p-well region and configured to be coupled to a first signal line or supply voltage, the first p-type anode region having a higher concentration of the p-type dopant than the first p-well region; a second p-type anode region surrounded by the second p-well region and configured to be coupled to a power supply node, the second p-type anode region having a higher concentration of the p-type dopant than the second p-well region; a first n-type cathode region surrounded by the first p-well region and configured to be coupled to the first signal line or supply voltage; and a second n-type cathode region surrounded by the second p-well region and configured to be coupled to the power supply node.

Example 13. The ESD protection circuit of example 12, further including a trigger device coupled to the at least one SCR.

Example 14. The ESD protection circuit of one of examples 12 or 13, where the first p-well region, the n-doped region, and the second p-well region form a PNP transistor.

Example 15. The ESD protection circuit of example 14, where the PNP transistor includes an n-well region, the n-well region being between the first p-well region and the second p-well region.

Example 16. The ESD protection circuit of one of examples 14 or 15, further including an n-doped tap region in the n-doped region, the n-doped tap region having a higher concentration of an n-type dopant than the n-doped region, where the n-doped region is coupled to a third trigger terminal through the n-doped tap region.

Example 17. The ESD protection circuit of example 16, further including an n-well region in the n-doped region, the n-well region having a higher concentration of the n-type dopant than the n-doped region and the n-well region having a lower concentration of the n-type dopant than the n-doped tap region.

Example 18. The ESD protection circuit of one of examples 16 or 17, where a trigger device is coupled to the at least one SCR through the third trigger terminal.

Example 19. The ESD protection circuit of one of examples 12 to 18, where the first n-type cathode region, the first p-well region, and the n-doped region form a first NPN transistor.

Example 20. The ESD protection circuit of example 19, where the first NPN transistor includes the first p-doped tap region.

Example 21. The ESD protection circuit of one of examples 12 to 20, where the second n-type cathode region, the second p-well region, and the n-doped region form a second NPN transistor.

Example 22. The ESD protection circuit of example 21, where the second NPN transistor includes the second p-doped tap region.

Example 23. The ESD protection circuit of one of examples 12 to 22, further including a deep trench isolation region surrounding the n-doped region.

Example 24. The ESD protection circuit of one of examples 12 to 23, further including an n-buried layer under the n-doped region.

Example 25. The ESD protection circuit of one of examples 12 to 24, further including a first deep p-type implant region under the first p-well region or a second deep p-type implant region under the second p-well region.

Example 26. A method of ESD protection using a silicon controlled rectifier (SCR) including a first p-well region, a second p-well region, and an n-doped region, the first p-well region coupled to a first trigger terminal via a first p-doped tap region disposed in the first p-well region, the first p-doped tap region having a higher concentration of a p-type dopant than the first p-well region, the second p-well region coupled to a second trigger terminal via a second p-doped tap region disposed in the second p-well region, the second p-doped tap region having a higher concentration of a p-type dopant than the second p-well region, the method including: detecting an ESD pulse using a trigger device; activating the SCR via the trigger device upon detection of the ESD pulse, where activating the SCR includes injecting a current through the first p-doped tap region or the second p-doped tap region; and conducting an ESD current via the SCR.

Example 27. A silicon controlled rectifier (SCR) device including: a first well region and a second well region in a substrate, the first well region and the second well region being a first semiconductor type with a first doping concentration, where a region of the substrate between the first well region and the second well region is a second semiconductor type, the second semiconductor type being opposite the first semiconductor type; a first electrode region in the first well region and a second electrode region in the second well region, the first electrode region and the second electrode region are the second semiconductor type; a third electrode region and a first tap region in the first well region, where the third electrode region and the first tap region have respective doping concentrations greater than the first doping concentration; and a fourth electrode region and a second tap region in the second well region, where the fourth electrode region and the second tap region have respective doping concentrations greater than the first doping concentration.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A semiconductor device comprising:

- a first p-well region and a second p-well region, the first p-well region and the second p-well region being in an n-doped region over a substrate;
- a first n-type cathode region in the first p-well region;
- a first p-type anode region in the first p-well region, the first n-type cathode region being between the first p-type anode region and the second p-well region, wherein the first p-type anode region has a higher concentration of a p-type dopant than the first p-well region;
- a second n-type cathode region in the second p-well region;
- a second p-type anode region in the second p-well region, the second n-type cathode region being between the second p-type anode region and the first p-well region, wherein the second p-type anode region has a higher concentration of the p-type dopant than the second p-well region;
- a first p-doped tap region in the first p-well region, the first p-doped tap region being between the first n-type cathode region and the second p-well region, the first p-doped tap region having a higher concentration of the p-type dopant than the first p-well region, sidewalls of the first p-doped tap region being covered by the first p-well region, the first p-doped tap region being coupled to the first n-type cathode region via a resistor; and
- a second p-doped tap region in the second p-well region, the second p-doped tap region being between the second n-type cathode region and the first p-well region, the second p-doped tap region having a higher concentration of the p-type dopant than the second p-well region.

2. The semiconductor device of claim 1, wherein the first n-type cathode region and the second n-type cathode region have a first doping concentration, the first p-well region and the second p-well region have a second doping concentration, and the first doping concentration is higher than the second doping concentration.

3. The semiconductor device of claim 1, wherein the first n-type cathode region and the first p-type anode region are configured to be coupled to a first signal line or supply potential, wherein the second n-type cathode region and the second p-type anode region are configured to be coupled to a power supply node, wherein the first p-doped tap region is configured to be coupled to a first trigger output, and wherein the second p-doped tap region is configured to be coupled to a second trigger output.

4. The semiconductor device of claim 3, further comprising a first n-well region in the n-doped region, the first n-well region being between the first p-well region and the second p-well region, the first n-well region having a higher concentration of an n-type dopant than the n-doped region.

5. The semiconductor device of claim 4, further comprising an n-doped tap region in the first n-well region, the n-doped tap region being coupled to a third trigger output, the n-doped tap region having a higher concentration of the n-type dopant than the first n-well region.

6. The semiconductor device of claim 1, further comprising a second n-well region in the n-doped region, the second n-well region having a higher concentration of an n-type dopant than the n-doped region, the second n-well region surrounding the first p-well region and the second p-well region.

7. The semiconductor device of claim 6, further comprising a highly n-doped ring region in the second n-well region, the highly n-doped ring region having a higher concentration of the n-type dopant than the second n-well region, the highly n-doped ring region surrounding the first p-well region and the second p-well region.

8. The semiconductor device of claim 1, further comprising a first deep p-type implant region under the first p-well region.

9. The semiconductor device of claim 8, wherein the first p-well region extends over a sidewall of the first deep p-type implant region in a direction towards the second p-well region.

10. The semiconductor device of claim 1, further comprising a first field plate above the n-doped region, the first field plate extending over respective sidewalls of the first p-well region.

11. The semiconductor device of claim 10, further comprising a second field plate above the n-doped region, the second field plate extending over respective sidewalls of the second p-well region.

12. An ESD protection circuit comprising:

- at least one silicon controlled rectifier (SCR) device comprising:
  - a first p-well region disposed in an n-doped region, the first p-well region coupled to a first trigger terminal via a first p-doped tap region, a longitudinal sidewall of the first p-doped tap region being aligned with a longitudinal sidewall of the first p-well region, the first p-doped tap region having a higher concentration of a p-type dopant than the first p-well region, sidewalls of the first p-doped tap region being covered by the first p-well region;
  - a second p-well region disposed in the n-doped region, the second p-well region coupled to a second trigger terminal via a second p-doped tap region, a longitudinal sidewall of the second p-doped tap region being aligned with a longitudinal sidewall of the second p-well region, the second p-doped tap region having a higher concentration of the p-type dopant than the second p-well region;
  - a first p-type anode region surrounded by the first p-well region and configured to be coupled to a first signal line or supply voltage, the first p-type anode region having a higher concentration of the p-type dopant than the first p-well region;

a second p-type anode region surrounded by the second p-well region and configured to be coupled to a power supply node, the second p-type anode region having a higher concentration of the p-type dopant than the second p-well region;

a first n-type cathode region surrounded by the first p-well region and configured to be coupled to the first signal line or supply voltage; and a second n-type cathode region surrounded by the second p-well region and configured to be coupled to the power supply node, the second n-type cathode region being coupled to the second p-doped tap region via a resistor.

13. The ESD protection circuit of claim 12, further comprising a trigger device coupled to the at least one SCR.

14. The ESD protection circuit of claim 12, wherein the first p-well region, the n-doped region, and the second p-well region form a PNP transistor.

15. The ESD protection circuit of claim 14, wherein the PNP transistor comprises an n-well region, the n-well region being between the first p-well region and the second p-well region.

16. The ESD protection circuit of claim 14, further comprising an n-doped tap region in the n-doped region, the n-doped tap region having a higher concentration of an n-type dopant than the n-doped region, wherein the n-doped region is coupled to a third trigger terminal through the n-doped tap region.

17. The ESD protection circuit of claim 16, further comprising an n-well region in the n-doped region, the n-well region having a higher concentration of the n-type dopant than the n-doped region and the n-well region having a lower concentration of the n-type dopant than the n-doped tap region.

18. The ESD protection circuit of claim 16, wherein a trigger device is coupled to the at least one SCR through the third trigger terminal.

19. The ESD protection circuit of claim 12, wherein the first n-type cathode region, the first p-well region, and the n-doped region form a first NPN transistor.

20. The ESD protection circuit of claim 19, wherein the first NPN transistor comprises the first p-doped tap region.

21. The ESD protection circuit of claim 12, wherein the second n-type cathode region, the second p-well region, and the n-doped region form a second NPN transistor.

22. The ESD protection circuit of claim 21, wherein the second NPN transistor comprises the second p-doped tap region.

23. The ESD protection circuit of claim 12, further comprising a deep trench isolation region surrounding the n-doped region.

24. The ESD protection circuit of claim 12, further comprising an n-buried layer under the n-doped region.

25. The ESD protection circuit of claim 12, further comprising a first deep p-type implant region under the first p-well region or a second deep p-type implant region under the second p-well region.

26. A method of ESD protection using a silicon controlled rectifier (SCR) comprising a first p-well region, a second p-well region, and an n-doped region, the first p-well region coupled to a first trigger terminal via a first p-doped tap region disposed in the first p-well region, the first p-doped tap region having a higher concentration of a p-type dopant than the first p-well region, the first p-doped tap region being coupled via a resistor to an n-type cathode region in the first p-well region, the second p-well region coupled to a second trigger terminal via a second p-doped tap region disposed in the second p-well region, the second p-doped tap region having a higher concentration of the p-type dopant than the second p-well region, the method comprising:

detecting an ESD pulse using a trigger device;

activating the SCR via the trigger device upon detection of the ESD pulse, wherein activating the SCR comprises injecting a current through the first p-doped tap region or the second p-doped tap region; and conducting an ESD current via the SCR.

27. A silicon controlled rectifier (SCR) device comprising:

a first well region and a second well region in a substrate, the first well region and the second well region being a first semiconductor type with a first doping concentration, wherein a region of the substrate between the first well region and the second well region is a second semiconductor type, the second semiconductor type being opposite the first semiconductor type;

a first electrode region in the first well region and a second electrode region in the second well region, the first electrode region and the second electrode region being the second semiconductor type;

a third electrode region and a first tap region in the first well region, the third electrode region and the first tap region having respective doping concentrations greater than the first doping concentration; and a fourth electrode region and a second tap region in the second well region, the fourth electrode region and the second tap region having respective doping concentrations greater than the first doping concentration, the second tap region being coupled via a resistor to the second electrode region.

* * * * *